(12) United States Patent
Kim

(10) Patent No.: US 9,964,991 B2
(45) Date of Patent: May 8, 2018

(54) ELECTRONIC DEVICE AND GRIP SENSING METHOD

(71) Applicant: Samsung Electronics Co., Ltd., Gyeonggi-do (KR)

(72) Inventor: Bong-Sub Kim, Daegu (KR)

(73) Assignee: Samsung Electronics Co., Ltd (KR)

( * ) Notice: Subject to any disclaimer, the term of this patent is extended or adjusted under 35 U.S.C. 154(b) by 132 days.

(21) Appl. No.: 14/850,323

(22) Filed: Sep. 10, 2015

(65) Prior Publication Data

US 2016/0076952 A1 Mar. 17, 2016

(30) Foreign Application Priority Data

Sep. 11, 2014 (KR) ........................ 10-2014-0120330

(51) Int. Cl.
*G06F 1/16* (2006.01)
*H03K 17/96* (2006.01)
(Continued)

(52) U.S. Cl.
CPC .......... *G06F 1/1626* (2013.01); *G06F 1/1684* (2013.01); *G06F 1/1698* (2013.01);
(Continued)

(58) Field of Classification Search
None
See application file for complete search history.

(56) References Cited

U.S. PATENT DOCUMENTS

| 5,956,626 A | 9/1999 | Kaschke et al. |
| 2003/0062907 A1 | 4/2003 | Nevermann |

(Continued)

FOREIGN PATENT DOCUMENTS

| EP | 2 683 144 | 1/2014 |
| JP | 2008-131516 | 6/2008 |

(Continued)

OTHER PUBLICATIONS

International Search Report dated Feb. 19, 2016 issued in counterpart application No. PCT/KR2015/009521, 11 pages.

(Continued)

*Primary Examiner* — Christopher Kohlman
(74) *Attorney, Agent, or Firm* — The Farrell Law Firm, P.C.

(57) ABSTRACT

An electronic device is provided. The electronic device includes a display; a housing including a front surface including the display, a rear surface facing a direction opposite to the front surface, and a side surface enclosing at least a part of a space defined between the front surface and the rear surface; a wireless communication module included in the housing; at least one antenna pattern electrically connected to the wireless communication module and configured to form an electromagnetic field or a magnetic field; a detection circuit electrically connected to the antenna pattern and configured to detect a current and/or a voltage associated with the antenna pattern; and a processor electrically connected to the wireless communication module and the detection circuit, wherein the processor is configured to change at least a part of an operation of the electronic device at least partly based on a change of the current and/or the voltage detected by the detection circuit.

26 Claims, 17 Drawing Sheets

(51) Int. Cl.
*H01Q 7/00* (2006.01)
*H04B 5/00* (2006.01)

(52) U.S. Cl.
CPC ............. *H01Q 7/00* (2013.01); *H03K 17/962* (2013.01); *H04B 5/0031* (2013.01); *H04B 5/0056* (2013.01); *H03K 2217/94089* (2013.01)

(56) References Cited

U.S. PATENT DOCUMENTS

| | | |
|---|---|---|
| 2013/0043835 A1 | 2/2013 | Yoon |
| 2013/0157565 A1 | 6/2013 | Clement et al. |
| 2013/0217342 A1 | 8/2013 | Abdul-Gaffoor et al. |
| 2013/0335319 A1* | 12/2013 | Balasundaram ...... G06F 3/0488 345/156 |
| 2014/0009172 A1* | 1/2014 | Rizkallah .......... H04M 1/72522 324/654 |
| 2014/0087786 A1 | 3/2014 | Tani et al. |
| 2014/0176306 A1 | 6/2014 | Lee et al. |
| 2014/0176447 A1* | 6/2014 | Alameh .................. G06F 3/044 345/173 |
| 2014/0192927 A1 | 7/2014 | Kim |
| 2015/0019892 A1* | 1/2015 | Agrawal ................... G06F 1/32 713/323 |
| 2015/0296065 A1* | 10/2015 | Narita ..................... H04M 1/64 455/556.2 |

FOREIGN PATENT DOCUMENTS

| | | |
|---|---|---|
| JP | 2008-309502 | 12/2008 |
| JP | 2013-009115 | 1/2013 |
| KR | 1020130019830 | 2/2013 |
| KR | 10-2013-0068250 | 6/2013 |
| KR | 10-2013-0134782 | 12/2013 |
| KR | 1020140090423 | 7/2014 |

OTHER PUBLICATIONS

European Search Report dated Mar. 28, 2018 issued in counterpart application No. 15839969.1-1221, 9 pages.

* cited by examiner

ELECTRONIC DEVICE AND GRIP SENSING METHOD

PRIORITY

This application claims priority under 35 U.S.C. § 119(a) to a Korean Patent Application filed on Sep. 11, 2014 in the Korean Intellectual Property Office and assigned Serial No. 10-2014-0120330, the entire content of which is incorporated herein by reference.

BACKGROUND

1. Field of the Disclosure

The present disclosure relates generally to an electronic device, and more particularly, to a grip sensing method in the electronic device.

2. Description of the Related Art

Recently, many portable electronic devices have been developed and used. For example, an electronic device, such as a portable phone, a smart phone, or a tablet personal computer (PC) executes various functions, such as a mobile communication function, a camera function, a video image reproducing function, and a web browser function, and for this purpose, is mounted with various components, such as an antenna, a speaker, and an integrated circuit (IC) or chip, and electrical elements.

Electronic devices have been developed to provide a user interface (UI) that enables intuitive input/output for the purpose of user convenience. For example, electronic devices have gradually evolved from a traditional UI type, in which information is input using a separate configuration, such as a keyboard, a keypad, or a mouse, to an intuitive UI type in which information is input by directly touching a screen using, for example, a finger or an electronic pen, or the voice. UI techniques are important since they allow users to use the electronic devices more conveniently and easily.

Recently, as an example of one type of intuitive UI, a UI through grip sensing has been developed. Grip sensing may be a technique for sensing grip, such as holding an electronic device in a user's hand. When the grip is sensed, the electronic device may recognize it as an input. Based on this, it is possible to use grip sensing as a method for changing the UI of an electronic device, executing a certain function, or transferring certain information to a user.

A conventional electronic device has been equipped with a separate grip sensor since such a grip sensor is necessary for grip sensing. However, in the case where an electronic device is equipped with the separate grip sensor, additional space may be required and component cost may increase.

Further, the conventional sensor is capable of performing grip sensing only when a direct contact is performed.

SUMMARY

An aspect of the present disclosure provides an electronic device and a grip sensing method in the electronic device, in which grip sensing is enabled by using a near field communication (NFC) function incorporated in the electronic device without using a separate grip sensor.

Another aspect of the present disclosure provides reduced cost by using NFC in an electronic device without using a separate grip sensor.

Another aspect of the present disclosure provides enhanced design flexibility with regard to space by not using a separate grip sensor.

Another aspect of the present disclosure provides grip sensing in an electronic device by bringing a user's hand close to an NFC antenna.

In accordance with an aspect of the present disclosure, an electronic device is provided. The electronic device includes a display; a housing including a front surface including the display, a rear surface facing a direction opposite to the front surface, and a side surface enclosing at least a part of a space defined between the front surface and the rear surface; a wireless communication module included in the housing; at least one antenna pattern electrically connected to the wireless communication module and configured to form an electromagnetic field or a magnetic field; a detection circuit electrically connected to the antenna pattern and configured to detect a current and/or a voltage associated with the antenna pattern; and a processor electrically connected to the wireless communication module and the detection circuit, wherein the processor is configured to change at least a part of an operation of the electronic device, at least partly based on a change of the current and/or the voltage detected by the detection circuit.

In accordance with another aspect of the present disclosure, a grip sensing method in an electronic device is provided. The grip sensing method includes supplying a current to an antenna pattern; detecting a current and/or a voltage by an electromagnetic field or a magnetic field formed by the antenna pattern as the current is supplied; and determining whether the electronic device is gripped based on the detected current and/or the detected voltage.

In accordance with another aspect of the present disclosure a non-transitory computer-readable storage medium that stores a grip sensing computer program therein, wherein, in an electronic device, the program executes a method is provided. The method includes supplying a current to an antenna pattern; detecting a current and/or a voltage by an electromagnetic field or a magnetic field formed by the antenna pattern as the current is supplied; and determining whether the electronic device is gripped based on the detected current and/or the detected voltage.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
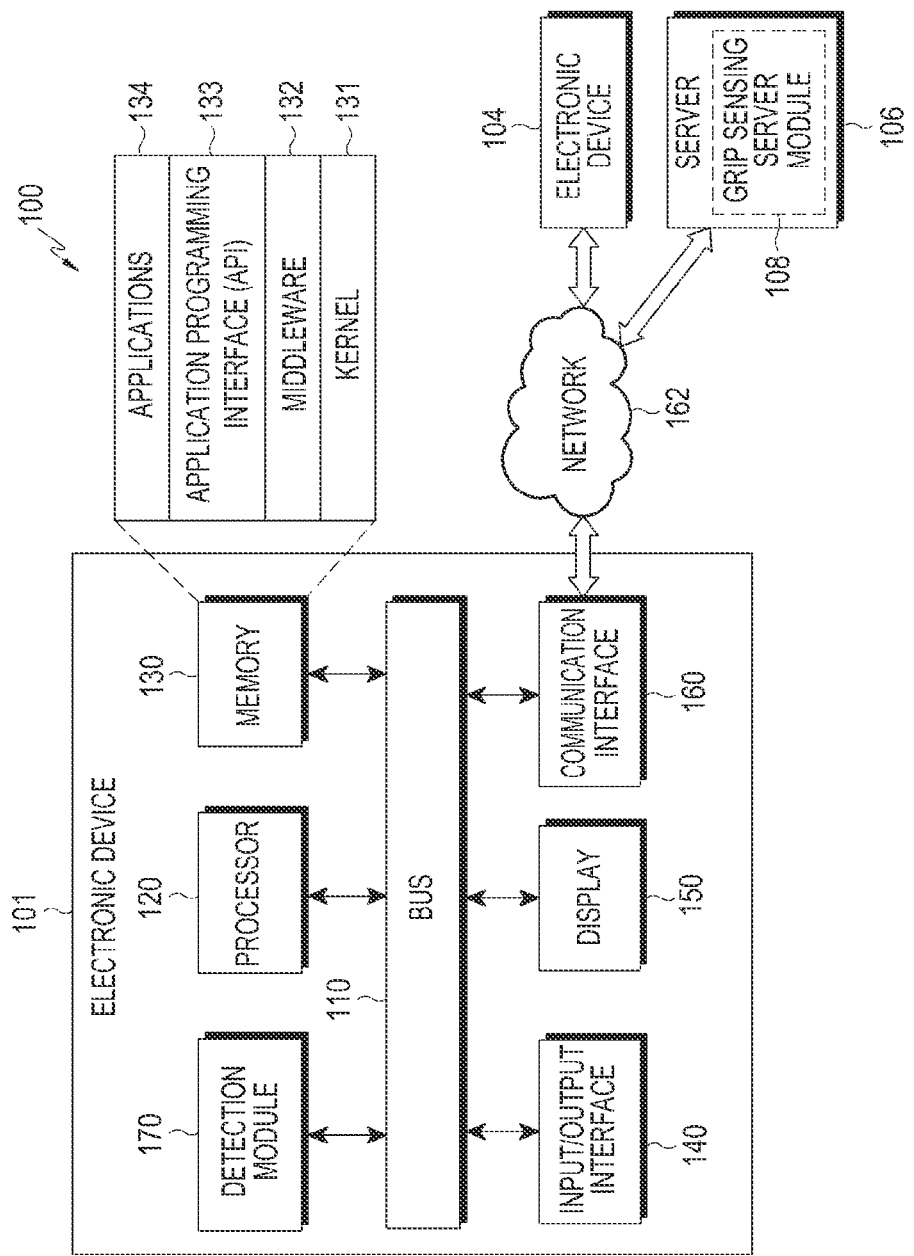
FIG. 1 is a block diagram of a network environment including an electronic device according to an embodiment of the present disclosure.

Hereinafter, various embodiments of the present disclosure are described with reference to the accompanying drawings. The present disclosure may be modified in various forms and includes various embodiments, but certain examples are illustrated in the drawings and described in the detailed description. However, it should be understood that there is no intent to limit the present disclosure to the particular forms disclosed herein; rather, the present disclosure should be construed to cover all modifications, equivalents, and/or alternatives falling within the scope and spirit of the present disclosure. In the description of the accompanying drawings, identical or similar reference numerals are used to designate identical or similar elements.

The terms "include" or "may include" refer to the existence of a corresponding disclosed function, operation or component which can be used in an embodiment of the present disclosure and do not limit one or more additional functions, operations, or components. In the present disclosure, terms such as "include" or "have" may be construed to denote a certain characteristic, number, step, operation, constituent element, component or a combination thereof, but are not to be construed to exclude the existence of or a possibility of addition of one or more other characteristics, numbers, steps, operations, constituent elements, components or combinations thereof.

In an embodiment of the present disclosure, the expressions "or" or "at least one of A and/or B" include any, or any combination, of the words listed together. For example, the expressions "A or B" or "at least A and/or B" may include A, B, or A and B.

The expressions such as "first," "second," or the like used in an embodiment of the present disclosure may modify various component elements in the embodiment but may not limit corresponding component elements. For example, the above expressions do not limit the sequence and/or importance of the elements. The above expressions are used merely for the purpose of distinguishing an element from another element. For example, a first user device and a second user device indicate different user devices although both of them are user devices. For example, without departing from the scope of the present disclosure, a first component element may be referred to as a second component element. Similarly, the second component element may also be referred to as the first component element.

It should be noted that if it is described that one component element is "coupled" or "connected" to another component element, the first component element may be directly coupled or connected to the second component, and a third component element may be "coupled" or "connected" between the first component element and the second component element. Conversely, when one component element is "directly coupled" or "directly connected" to another component element, it may be construed that a third component element does not exist between the first component element and the second component element.

The terms in various embodiments of the present disclosure are used to describe a certain embodiment, and are not intended to limit the present disclosure. As used herein, the singular forms are intended to include the plural forms as well, unless the context clearly indicates otherwise.

Unless defined differently, all terms used herein, which include technical terms or scientific terms, have the same meanings as commonly understood by a person skilled in the art to which the present disclosure belongs. Such terms as those defined in a generally used dictionary are to be interpreted to have the meanings consistent with the contextual meanings in the relevant field of art, and are not to be interpreted to have ideal or excessively formal meanings unless clearly defined in the present disclosure.

An electronic device according to an embodiment of the present disclosure may be a device having a grip sensing function. For example, the electronic device may include at least one of a smart phone, a tablet personal computer (PC), a mobile phone, a video phone, an e-book reader, a desktop PC, a laptop PC, a netbook computer, a personal digital assistant (PDA), a portable multimedia player (PMP), a moving picture experts group audio layer 3 (MP3) player, a mobile medical device, a camera, a wearable device (e.g., a head-mounted-device (HMD) such as electronic glasses, electronic clothes, an electronic bracelet, an electronic necklace, an electronic appcessory, an electronic tattoo, or a smart watch).

According to an embodiment of the present disclosure, the electronic device may be a smart home appliance with a finger print function. The smart home appliance as an example of the electronic device may include at least one of, for example, a television, a digital video disk (DVD) player, an audio player, a refrigerator, an air conditioner, a vacuum cleaner, an oven, a microwave oven, a washing machine, an air cleaner, a set-top box, a TV box (e.g., Samsung HomeSync™, Apple TV™, or Google TV™), a game console, an electronic dictionary, an electronic key, a camcorder, and an electronic picture frame.

According to an embodiment of the present disclosure, the electronic device may include at least one of various medical devices {e.g., a magnetic resonance angiography (MRA), a magnetic resonance imaging (MRI), a computed tomography (CT) machine, and an ultrasonic machine}, navigation devices, global positioning system (GPS) receivers, event data recorders (EDR), flight data recorders (FDR), vehicle infotainment devices, electronic devices for ships (e.g., navigation devices for ships, and gyro-compasses), avionics, security devices, automotive head units, robots for home or industry, automatic teller machines (ATMs), or point of sale (POS) machines in vending areas.

According to an embodiment of the present disclosure, an electronic device may include at least one of furniture or a part of a building/structure, an electronic board, an electronic signature receiving device, a projector, and various types of measuring devices (for example, a water meter, an electric meter, a gas meter, a radio wave meter and the like) including a camera function. An electronic device according to an embodiment of the present disclosure may be a combination of one or more of the above described various devices. Also, an electronic device according to an embodiment of the present disclosure may be a flexible device. Also, an electronic device according to an embodiment of the present disclosure is not limited to the above described devices.

Hereinafter, an electronic device according to an embodiment of the present disclosure is described with reference to the accompanying drawings. The term "user" may refer to a person who uses an electronic device or a device (for example, an artificial intelligence electronic device) that uses an electronic device.

FIG. 1 is a block diagram of a network environment 100 including an electronic device 101 according to an embodiment of the present disclosure.

Referring to FIG. 1, the electronic device 101 may include a bus 110, a processor 120, a memory 130, an input/output interface 140, a display 150, a communication interface 160, and a detection module 170.

The bus 110 may be a circuit that connects the above-identified elements and communicates data (e.g., a control message) between the elements.

The processor 120 may receive commands from the other components (e.g., the memory 130, the input/output interface 140, the display 150, the communication interface 160, or the detection module 170, etc.) through the bus 110, interpret the received commands, and perform an arithmetic operation or process data based on the interpreted commands.

The memory 130 may, therein, store commands or data received from or created by the processor 120 or other components (e.g., the input/output interface 140, the display 150, the communication interface 160, or the detection module 170, etc.). The memory 130 may include programming modules such as a kernel 131, a middleware 132, an application programming interface (API) 133, and applications 134. Each of the programming modules may be composed of software, firmware, hardware, and any combination thereof.

The kernel 131 may control or manage system resources (e.g., the bus 110, the processor 120, or the memory 130, etc.) used for performing operations or functions implemented in the remaining other programming modules, e.g., the middleware 132, the API 133, or the applications 134. In addition, the kernel 131 may provide an interface that allows the middleware 132, the API 133 or the applications 134 to access, control or manage individual components of the electronic device 101.

The middleware 132 may play an intermediary role such that the API 133 or the application 134 may communicate with the kernel 131 to exchange data. In addition, in connection with task requests received from the applications 134, the middleware 132 may perform a control (e.g., scheduling or load balancing) for the task requests by using, for example, a method of assigning the priority for using a system resource of the electronic device 101 (e.g., the bus 110, the processor 120, or the memory 130) to at least one of the applications 134.

The API 133, which is an interface for allowing the applications 134 to control a function provided by the kernel 131 or the middleware 132, may include, for example, at least one interface or function (e.g., a command) for file control, window control, image processing, text processing, for example.

According to various embodiments, the applications 134 may include, for example, a short message service/multimedia messaging service (SMS/MMS) application, an email application, a calendar application, an alarm application, a health care application (e.g., an application for measuring a quantity of motion or blood sugar level), and an environmental information application (e.g., an application for providing, for example, atmospheric pressure, humidity or temperature information). Additionally or alternatively, the applications 134 may include an application associated with information exchange between the electronic device 101 and an external electronic device 104. The application associated with information exchange may include, for example, a notification relay application for delivering certain information to an external electronic device, or a device management application for managing an external electronic device.

For example, the notification relay application may include a function to deliver notification information created by any other application of the electronic device 101 (e.g., the SMS/MMS application, the email application, the health care application, or the environmental information application, etc.) to an external electronic device 104. Additionally or alternatively, the notification relay application may receive notification information from an external electronic device 104 and provide it to a user. The device management application may manage (e.g., install, remove or update) a certain function (turn-on/turn-off an external electronic device (or some components thereof), or make an adjustment of brightness (or resolution) of a display) of any external electronic device 104 communicating with the electronic device 101, an application operating at such an external electronic device, or a service (e.g., a call service or a message service) provided by such an external electronic device.

According to an embodiment of the present disclosure, the applications 134 may include an application designated depending on an attribute (e.g., a type of an electronic device) of an external electronic device 104. For example, in a case where the external electronic device is an MP3 player, the applications 134 may include an application associated with music reproduction. Similarly, in a case where the external electronic device is a portable medical device, the applications 134 may include an application associated with health care. According to an embodiment of the present disclosure, the applications 134 may include at least one of an application designated to the electronic device 101 and an application received from an external electronic device (e.g., the server 106 or the electronic device 104).

The input/output interface 140 may deliver commands or data, entered by a user through an input/output unit (e.g., a sensor, a keyboard, or a touch screen), to the processor 120, the memory 130, the communication interface 160, or the detection module 170 via the bus 110. For example, the input/output interface 140 may provide data about a user's touch, entered through the touch screen, to the processor 120. Also, through the input/output unit (e.g., a speaker or a display), the input/output interface 140 may output commands or data, received from the processor 120, the memory 130, the communication interface 160, or the detection module 170 via the bus 110. For example, the input/output interface 140 may output voice data, processed through the processor 120, to a user through the speaker.

The display 150 may display thereon various types of information (e.g., multimedia data and text data) to a user.

The communication interface 160 may establish communication between the electronic device 101 and any external electronic device 104 or the server 106. For example, the communication interface 160 may communicate with any external device by being connected with a network 162 through a wired or wireless communication. The wireless communication may include, for example, at least one of wireless fidelity (WiFi), Bluetooth (BT), near field communication (NFC), global positioning system (GPS), and a cellular communication (e.g., long term evolution (LTE), LTE advanced (LTE-A), code division multiple access (CDMA), wideband CDMA (WCDMA), universal mobile telecommunications system (UMTS), wireless broadband (WiBro), or global system for mobile communication (GSM)). The wired communication may include, for example, at least one of universal serial bus (USB), high definition multimedia interface (HDMI), recommended standard 232 (RS-232), and plain old telephone service (POTS).

According to an embodiment of the present disclosure, the network 162 may be a communication network (telecommunication network). The communication network may include at least one of a computer network, the internet, an internet of things, and a telephone network. According to an embodiment of the present disclosure, a protocol (e.g., transport layer protocol, data link layer protocol, or physical layer protocol) for a communication between the electronic device 101 and any external device may be supported by at least one of the applications 134, the API 133, the middleware 132, the kernel 131, and the communication interface 160.

According to an embodiment of the present disclosure, the server 106 may support the driving of the electronic device 101 by performing at least one operation among the operations (or functions) implemented in the electronic device 101. For example, the server 106 may include a grip sensing server module 108 capable of supporting the detection module 170 implemented in the electronic device 101. For example, the grip sensing server module 108 may include at least one component of the detection module 170 so as to perform (e.g., act as a proxy) at least one operation among the operations performed by the detection module 170.

The detection module 170 may process at least a part of information obtained from the other components (e.g., the processor 120, the memory 130, the input/output interface 140, and the communication interface 160) and provide the processed information to a user in various ways. For example, the detection module 170 may control at least some function of the electronic device 101 by using the processor 120 or independently of the processor 120 such that the electronic device 101 may be co-operated by any other electronic device (e.g., the electronic device 104 or the server 106). According to an embodiment of the present disclosure, at least one configuration of the detection module 170 may be included in the server 106 (e.g., the grip sensing server module 108), and the detection module 170 may receive support from at least one operation implemented therein by the server 106.

Figure 2:
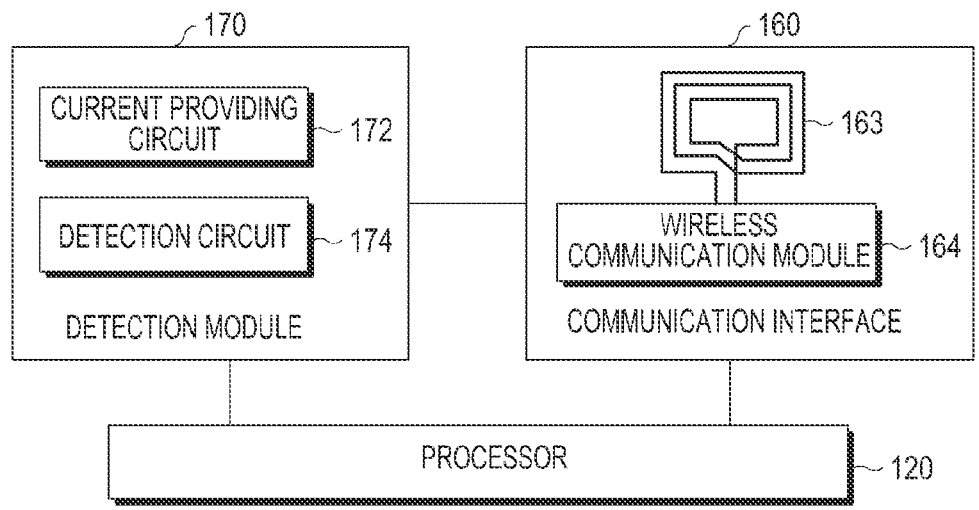
FIG. 2 is a block diagram of an electronic device for grip sensing according to an embodiment of the present disclosure.

FIG. 2 is a block diagram of an electronic device for grip sensing according to an embodiment of the present disclosure.

Referring to FIG. 2, in an embodiment of the present disclosure, for the purpose of grip sensing, an electronic device 101 may include a detection module 170, a communication interface 160, and a processor 120.

The communication interface 160 may include at least one antenna pattern 163, and a wireless communication module 164. When a current is supplied to the antenna pattern 163, a magnetic field (magnetic fluxes) or an electromagnetic field may be formed. According to an embodiment of the present disclosure, the antenna pattern 163 may be a radiator in the form of a loop antenna. When an object disturbs the magnetic fluxes by approaching the loop antenna pattern 163, the fluxes of the magnetic field may be reduced. Due to the change in magnetic fluxes of the magnetic field, the current flowing in the loop antenna pattern 163 may be changed. According to an embodiment of the present disclosure, the object disturbing the magnetic fluxes may be an object that has an influence on the magnetic field, such as a user's body (e.g., a hand or a finger). According to an embodiment of the present disclosure, the antenna pattern 163 may be an NFC antenna pattern. The wireless communication module 164 may be electrically connected to the antenna pattern 163, and perform a wireless communication using the antenna pattern 163.

The detection module 170 may include a current providing circuit 172, and a detection circuit 174.

The current providing circuit 172 may provide a current to the antenna pattern 163 under control of the processor 120. According to an embodiment of the present disclosure, the processor 120 may control the current providing circuit 172 to provide a current to the antenna pattern 163 according to a set polling period. According to an embodiment of the present disclosure, an alternating current may be provided to the antenna pattern 163. According to an embodiment of the present disclosure, the polling period may be set by a manufacturer when the electronic device is provided, or may be set by, for example, a user's use pattern or grip habit.

As the alternating current is provided to the antenna pattern 163, the detection circuit 174 may detect a current or voltage flowing or applied across opposite ends of the antenna pattern 163. According to an embodiment of the present disclosure, the detection circuit 174 may accumulate the alternating current flowing across the opposite ends of the antenna pattern 163, and detect a voltage by converting the voltage value corresponding to the accumulated current into digital data.

The processor 120 may detect the digital value of the voltage value corresponding to the accumulated current and/or the voltage value detected by the detection circuit 174, and may determine which voltage level the detected voltage corresponds to among set voltage levels. According to an embodiment of the present disclosure, the set voltage levels may be set by a manufacturer when the electronic device is provided, or may be set by a user's use pattern or grip habit.

According to an embodiment of the present disclosure, the predetermined voltage levels may include at least one of a voltage level corresponding to a case where no object is brought close to the electronic device 101, a voltage level corresponding to a state where the electronic device 101 is gripped by a user's hand, a voltage level corresponding to a case where a metallic material is brought close to the electronic device 101, and a voltage level corresponding to a case where an object, having an influence on a magnetic field, other than a hand or a metallic material, is brought close to the electronic device 101.

According to an embodiment of the present disclosure, the predetermined voltage levels may include at least one of a voltage level corresponding to a state where the electronic device 101 is gripped by some fingers as well as a hand, a voltage level corresponding to a state where the electronic device 101 is gripped by a hand at a first intensity, for example, weakly, and a voltage level corresponding to a state where the electronic device 101 is gripped by a hand at a second intensity, for example, strongly.

According to an embodiment of the present disclosure, an electronic device 101 may include a display; a housing including a front surface including the display, a rear surface facing a direction opposite to the front surface, and a side surface enclosing at least a part of a space defined between the front surface and the rear surface; a wireless communication module included in the housing; at least one antenna pattern electrically connected to the wireless communication module and configured to form an electromagnetic field or a magnetic field; a detection circuit electrically connected to the antenna pattern and detecting a current and/or a voltage associated with the antenna pattern; and a processor electrically connected to the wireless communication module and the detection circuit. The processor may change at least a part of an operation of the electronic device at least partly based on the change of the current and/or the voltage detected by the detection circuit.

According to an embodiment of the present disclosure, the at least one antenna pattern may include at least one of a first antenna pattern extending along at least one side surface of the display to be adjacent to a part of the front surface, and disposed within the housing; a second antenna pattern disposed within the housing to be adjacent to a part of the rear surface; and a third antenna pattern forming at least a part of the side surface.

According to an embodiment of the present disclosure, the at least one antenna pattern may be a loop antenna pattern.

According to an embodiment of the present disclosure, the at least one antenna pattern may be an NFC antenna pattern.

According to an embodiment of the present disclosure, when the detected voltage corresponds to a voltage level of a gripped state, the processor may determine that the electronic device is in a gripped state, and when the detected voltage does not correspond to the voltage level of the gripped state, the processor may determine that the electronic device is in a non-gripped state.

According to an embodiment of the present disclosure, when the detected voltage returns to a default state from a state where the electronic device is gripped, the processor may determine that the gripped state of the electronic device is released.

According to an embodiment of the present disclosure, the electronic device may further include a current providing circuit that supplies the current to the at least one antenna pattern according to a predetermined period.

According to an embodiment of the present disclosure, the predetermined period is changed to any one of a first period and a second period depending on whether the display unit is turned on or turned off.

According to an embodiment of the present disclosure, the predetermined period may be changed to any one of a first period and a second period depending on whether the electronic device moves.

According to an embodiment of the present disclosure, the processor may determine which voltage level the detected voltage corresponds to among a plurality of predetermined voltage levels.

According to an embodiment of the present disclosure, the plurality of predetermined voltage levels may include at least one of a voltage level in a state where no object is brought close to the electronic device; a voltage level corresponding to a state where the electronic device is gripped; a voltage corresponding to a case where a metallic material is brought close to the electronic device; and a voltage level corresponding to a case where an object, having an influence on a magnetic field, other than a hand or a metallic material, is brought close to the electronic device.

According to an embodiment of the present disclosure, the plurality of predetermined voltage levels may include at least one of a voltage level corresponding to a state where a part of a finger contacts the electronic device; a voltage level corresponding to a state where the electronic device is gripped with a first intensity; and a voltage level corresponding to a state where the electronic device is gripped with a second intensity.

According to an embodiment of the present disclosure, the voltage level corresponding to the gripped state may be a voltage reduced from a voltage of a default state within a predetermined voltage level range.

Figure 3:
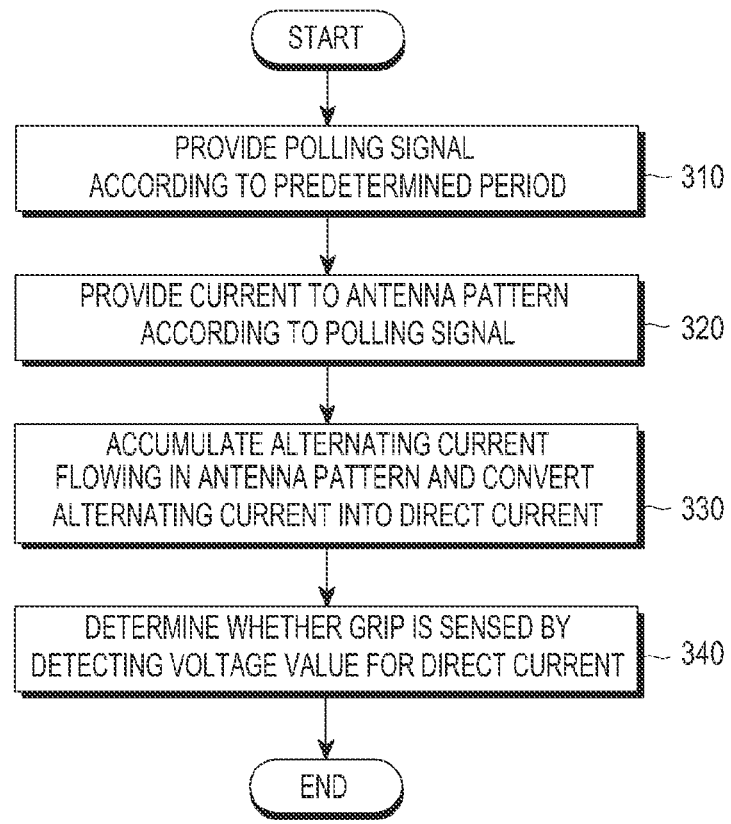
FIG. 3 is a flowchart of a grip sensing method of an electronic device according to an embodiment of the present disclosure.

FIG. 3 is a flowchart of a grip sensing method of an electronic device according to an embodiment of the present disclosure.

Referring to FIG. 3, the electronic device 101 may provide a polling signal according to a predetermined polling period in step 310. According to an embodiment of the present disclosure, the predetermined polling period may be changed depending on whether a display 150 is in a turned-on state or a turned-off state. For example, when the display 150 is in the turned-on state, the probability that the user uses the electronic device 101 (a probability that the electronic device 101 is gripped or is to be gripped) is high. Thus, the polling period may be set to a first period, for example, a short period. When the display 150 is in the turned-off state, the probability that the user uses the electronic device 101 (a probability that the electronic device is gripped) is low. Thus, the polling period may be set to a second period, for example, a long period.

In step 320, the electronic device 101 may provide a current to the antenna pattern 163 according to a polling signal. As the current is provided, a magnetic field (magnetic fluxes) may be formed in the antenna pattern 163. According to an embodiment of the present disclosure, the antenna pattern 163, when an object disturbs the magnetic fluxes by being brought close to the electronic device 101, the fluxes of the magnetic field may be reduced. Due to the change of fluxes in the magnetic field, the current flowing in the antenna pattern 163 may be changed. According to an embodiment of the present disclosure, the object disturbing the magnetic fluxes may be an object having an influence on the magnetic field, such as the user's body (e.g., a hand or a finger) or a metallic material.

In step 330, the electronic device 101 may accumulate the alternating current flowing in the antenna pattern 163 and convert the alternating current into a direct current. According to an embodiment of the present disclosure, the detection circuit 174 may detect a voltage corresponding to the accumulated current.

In step 340, the electronic device 101 may detect the voltage value according to the converted direct current, and determine whether a grip is sensed using the detected voltage. According to an embodiment of the present disclosure, the electronic device 101 may determine which voltage level the detected voltage corresponds to among the predetermined voltage levels.

According to an embodiment of the present disclosure, the voltage levels may include at least one of a voltage level corresponding to a case where no object is brought close to the electronic device 101, a voltage level corresponding to a state where the electronic device 101 is gripped by the user's hand, a voltage level corresponding to a case where a metallic material is brought close to the electronic device 101, and a voltage level corresponding to a case where an object, having an influence on a magnetic field, other than a hand or a metallic material, is brought close to the electronic device 101. According to an embodiment of the present disclosure, the voltage levels may be classified according to a state where the electronic device 101 is gripped by a hand. For example, the voltage levels may include at least one of a voltage level corresponding to a state where the electronic device 101 is gripped by some fingers, a voltage level corresponding to state where the electronic device 101 is weakly gripped by a hand, and a voltage level corresponding to a state where the electronic device 101 is strongly gripped by a hand. The electronic device 101 may display a set UI or perform a set function based on a measured voltage level. According to an embodiment of the present disclosure, the electronic device 101 may be a terminal of a size that can be handheld by a user.

Figure 4:
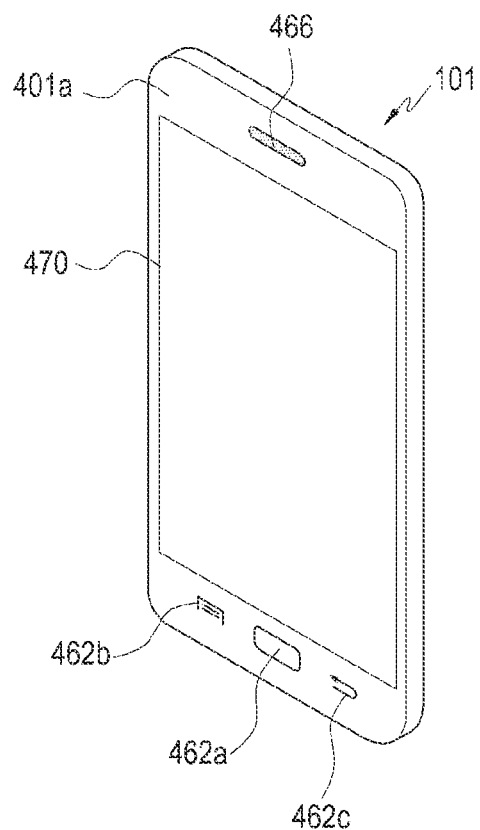
FIG. 4 is a perspective view of an electronic device according to an embodiment of the present disclosure.

FIG. 4 is a perspective view of an electronic device according to an embodiment of the present disclosure.

Referring to FIG. 4, a touch screen 470 may be disposed in a central portion of the front surface 401a of the housing of the electronic device 101. The touch screen 470 may be formed in a large size to occupy most of the front surface 401a. The touch screen 470 may display various screens. Below the touch screen 470, a home button 462a, a menu button 462b, and a back button 462c may be formed. The home button 462a may cause a main home screen to be displayed on the touch screen 470. For example, when the home button 462a is touched, the main home screen may be displayed on the touch screen 470. In addition, when the home button 462a is touched while applications are executed on the touch screen 470, the main home screen may be displayed on the touch screen 470. The menu button 462b provides connection menus which are capable of being used on the touch screen 470. The connection menus may include, for example, a widget adding menu, a background screen change menu, a search menu, an edition menu, and an environment setting menu. The back button 462c may cause a screen, which has been executed just before the currently executed screen, to be displayed, or the most recently used application to be terminated. On the upper portion of the front surface 401a of the electronic device 101, a speaker 466 may be disposed. According to an embodiment of the present disclosure, an antenna pattern may be disposed at various positions on the electronic device 101.

Figure 5A:
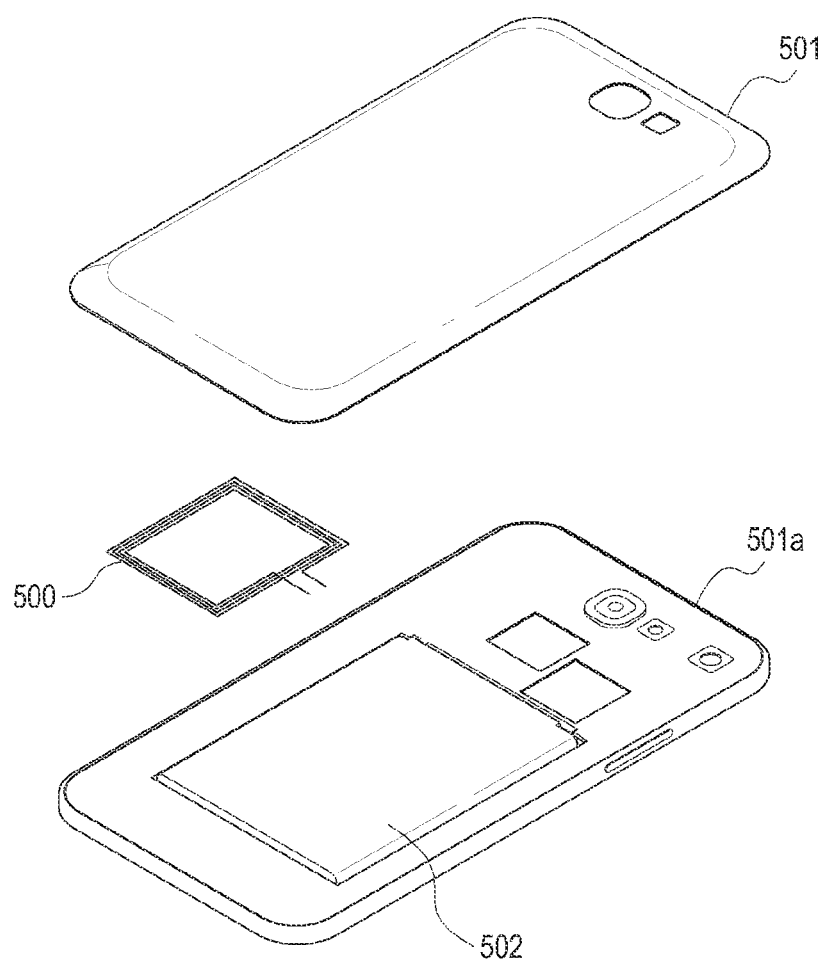
FIGS. 5A to 5C are an exploded view and perspective views, respectively, of a case in which an antenna is disposed between a main body and a rear cover of an electronic device, according to embodiments of the present disclosure.
Figure 5B:
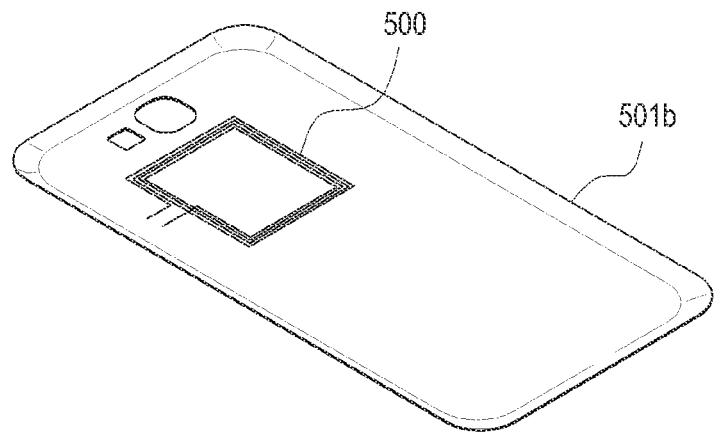
Figure 5C:
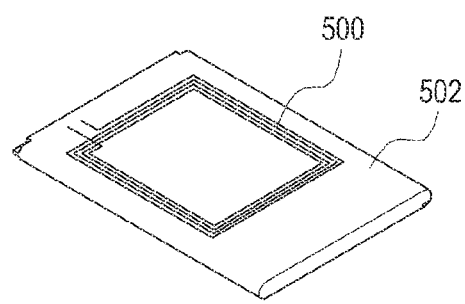

FIGS. 5A to 5C are an exploded view and perspective views illustrating a case where an antenna pattern is disposed between a main body and a rear cover of an electronic device, according to embodiments of the present disclosure.

Referring to FIG. 5A, for example, the electronic device 101 may include a main body 501a and a rear cover 501b removably attached to the rear surface of the main body 501a, and an antenna pattern 500 may be disposed between the main body 501a and the rear cover 501b. A battery 502 may be seated on the rear surface of the main body 501a. In a state where the battery 502 is seated on the main body 501a, the rear cover 501b is coupled to the main body 501a to form a housing.

Referring to FIG. 5B, in still another example, the antenna pattern 500 may be attached to the rear cover 501b. According to an embodiment of the present disclosure, the antenna pattern 500 may be in a form molded in the inside of the rear cover 501b.

Referring to FIG. 5C, in yet another example, the antenna pattern 500 may be attached to a battery 502 detachably attached to the main body 501a.

Figure 6:
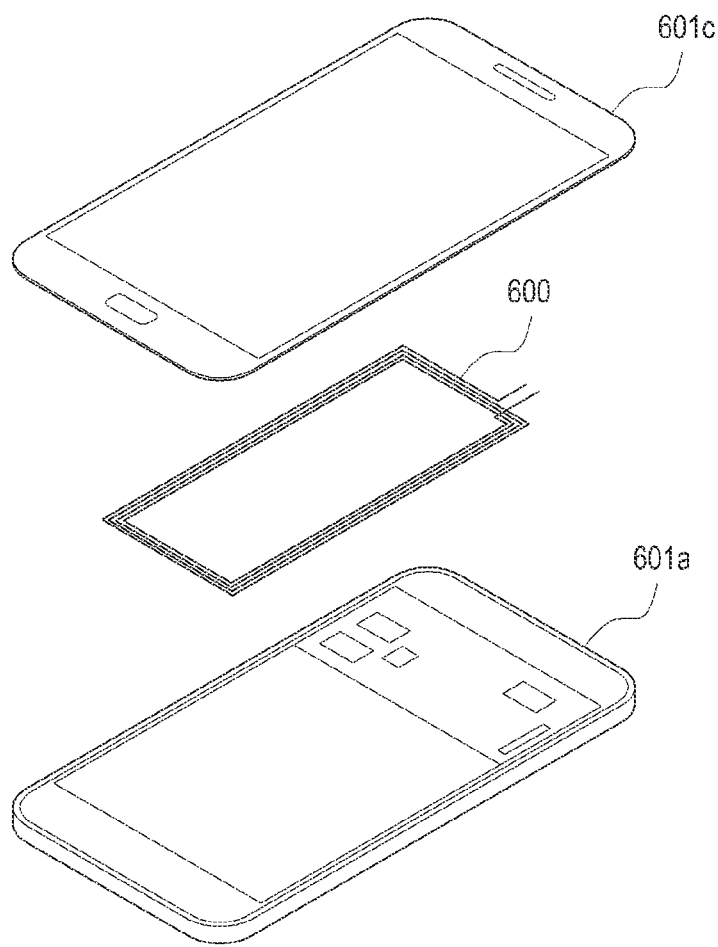
FIG. 6 is an exploded view of a case in which an antenna is disposed between a main body and a front case of an electronic device, according to an embodiment of the present disclosure.

FIG. 6 is an exploded view of a case where an antenna is disposed between a main body and a front case of an electronic device, according to an embodiment of the present disclosure.

Referring to FIG. 6, the electronic device 101 may include a main body 601a, a front case 601c attached to the front surface of the main body 601a, and an antenna pattern 600 disposed between the main body 601a and the front case 601c. According to an embodiment of the present disclosure, the front case 601c may be a window member. The antenna pattern 600 positioned between the main body 601a and the front case 601c may be provided in a form having a pattern to be operated as an antenna on at least a part of the front case. For example, the antenna pattern 600 may be provided in a form evenly spread over the entire front case. Alternatively, the antenna pattern 600 may be provided in a form enclosing a bezel portion of the touch panel where a touch input is conducted (e.g., an area of the front case which is touched as being gripped by a user's hand).

Figure 7A:
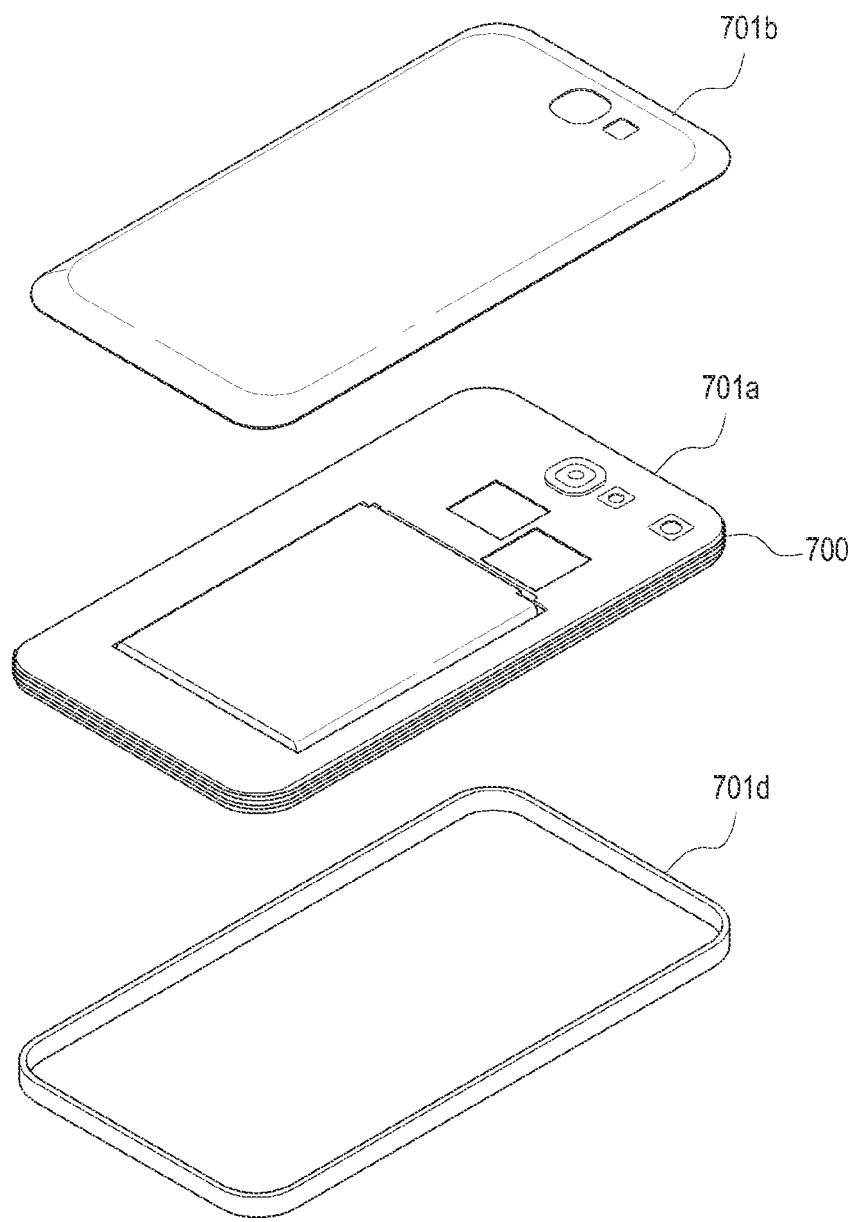
FIGS. 7A and 7B are exploded views of cases where an antenna is disposed on a side periphery of a main body of an electronic device, according to embodiments of the present disclosure.
Figure 7B:
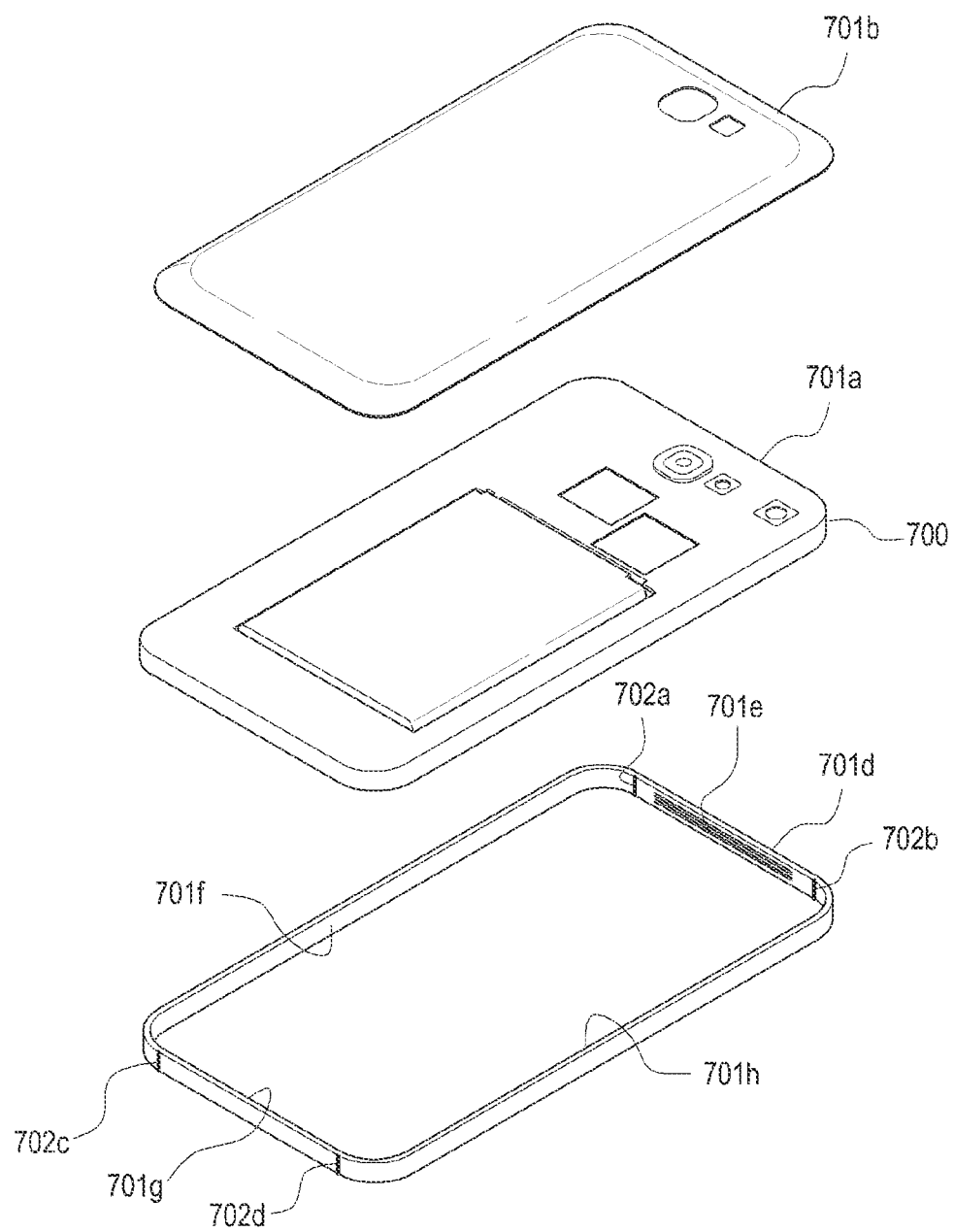

FIGS. 7A and 7B are exploded views of cases where an antenna is disposed around a side surface of a main body of an electronic device.

Referring to FIG. 7A, the electronic device 101 may include a main body 701a, a rear cover 701b detachably attached to the rear surface of the main body 701a, a side case 701d enclosing the side surfaces of the main body 701a, and an antenna pattern 700 is disposed around the side periphery of the main body 701a. The side case 701d may be configured to enclose an antenna pattern 700 disposed on the side periphery of the main body 701a. According to an embodiment of the present disclosure, the rear cover 701b and the side case 701d may be integral with each other, the antenna pattern 700 may be disposed around the side periphery of the main body 701a, and the integral case, including the rear cover 701b and the side case 701d, may enclose the antenna pattern 700 disposed around the side periphery of the main body 701a.

Referring to FIG. 7B, the electronic device 101 may include a main body 701a, a rear cover 701b attachable to/detachable from the rear surface of the main body 701a, and a side case 701d that encloses side surfaces of the main body 701a. When the side case 701d is made of metal, a portion of the side case 701d may be formed as an antenna pattern 700. When the side case 701d is not made of metal, an antenna pattern 700 may be mounted on at least a portion of the inner side of the side case 701d. According to an embodiment of the present disclosure, the side case 701d may include at least one pair of segmented portions. For example, the side case 701d may be divided into two portions that are isolated from each other by the segmented portions. Any one of the isolated portions may be formed as an antenna pattern (e.g., a NFC antenna) 700 or an inner antenna pattern 700 may be mounted on an inner side of any one of the isolated portions. According to FIG. 7B, the side case 701d may include two pairs of segmented portions 702a, 702b, 702c, and 702d, and the side case 701d may be divided into four portions 701e, 701f, 701g, and 701h that are isolated from each other by the segmented portions 702a, 702b, 702c, and 702d. Any one of the isolated portions may be formed as an antenna pattern 700, or an inner antenna pattern 700 may be mounted on the inner side of any one of the isolated portions.

Figure 8A:
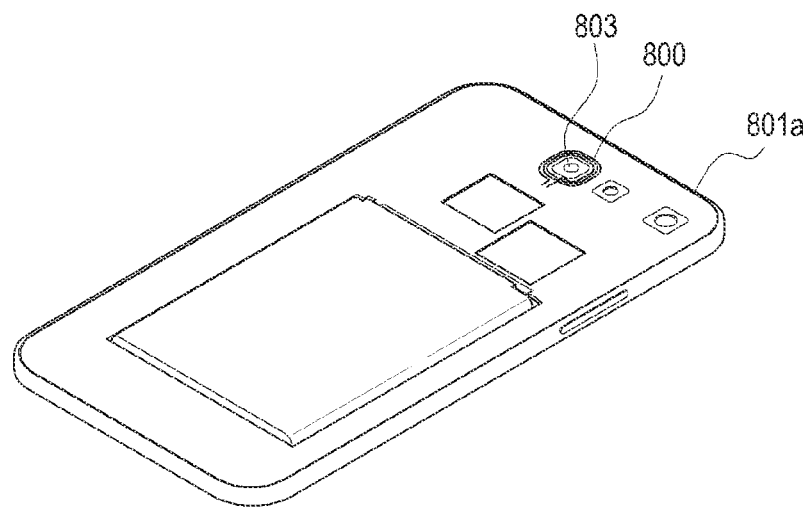
FIGS. 8A and 8B are perspective views of a case where an antenna is disposed around a camera of an electronic device, according to an embodiment of the present disclosure.
Figure 8B:
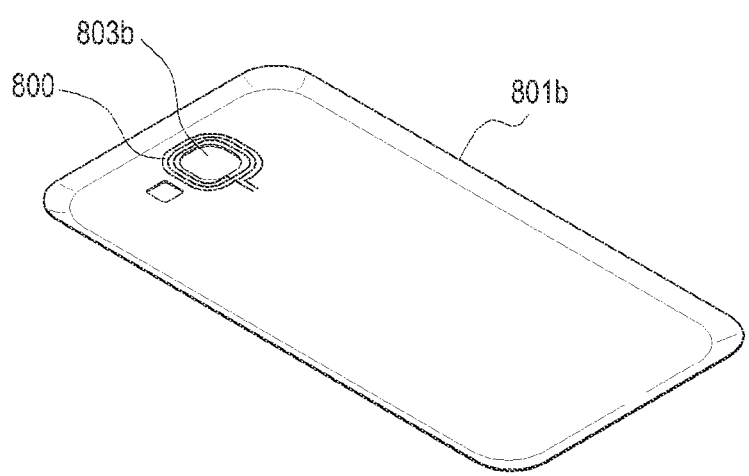

FIGS. 8A and 8B are perspective views of a case where an antenna is disposed around a camera of an electronic device, according to an embodiment of the present disclosure.

Referring to FIGS. 8A and 8B, a camera 803 may be included in the rear surface of a main body 801a, and an opening 803b may be formed in a rear cover 801b to correspond to the position of the camera 803 of the main body 801a so as to accommodate the camera 803. According to an embodiment of the present disclosure, the antenna 800 may be attached around the camera 803 of the main body 801a, as illustrated in FIG. 8A. According to an embodiment of the present disclosure, as illustrated in FIG. 8B, the antenna 800 may be attached around the opening 803b of the camera 803 in which the rear cover 801b is accommodated.

According to an embodiment of the present disclosure, an antenna pattern may be disposed at a different position and in a different method, other than various positions of the above-described electronic device 101.

Figure 9:
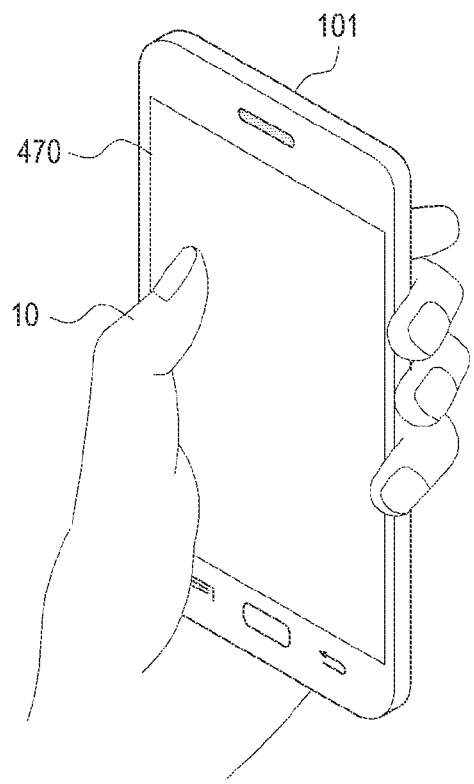
FIG. 9 is a perspective view of an electronic device being gripped, according to an embodiment of the present disclosure.

FIG. 9 is a perspective view of an electronic device 101 according to an embodiment of the present disclosure, in a gripped state.

Referring to FIG. 9, a user may grip the electronic device 101 by a hand 10. The term "grip" may refer to holding or clasping the electronic device 101. When the electronic device 101 is gripped by the user's hand 10, a magnetic field of the antenna pattern provided in the electronic device 101 may be changed, and a voltage change value may be measured based on the change in the magnetic field so as to sense that the electronic device 101 is gripped. According to an embodiment of the present disclosure, the difference in the voltage value may be measured differently depending on a gripping time, the number of times the electronic device 101 is gripped, and a gripping area, and operations, such as UI change, and execution and termination of a certain function, may be performed based on the measured voltage value. For example, in a case in which, when answering a phone call, the user brings the electronic device 101 to the user's ear in a state where the user grips the electronic device 101, the operation of answering the phone call may be performed by sensing the grip and sensing the user's movement through an earth magnetic field sensor. For example, when the voltage value detected by the detection module is dropped from 9 volts (i.e., 9 V) to 5 V, the electronic device may determine that the electronic device 101 is gripped by the user, and operate grip sensing mode in which the Specific Absorption Rate (SAR) is reduced. And, when the voltage value further drops from 5V to 3V, the electronic device may determine that the electronic device 101 is gripped and then held to the user's ear by the user. When the electronic device is gripped and then held to the user's ear by the user, the electronic device 101 may perform an operation of turning off the display screen and thus power consumption is reduced. In another example, when the user performs an action of removing from or placing at least a part of a finger positioned around the antenna in the state where the user grips the electronic device 101, a change in magnetic field may be induced and a certain function may be performed based on this action.

Figure 10:
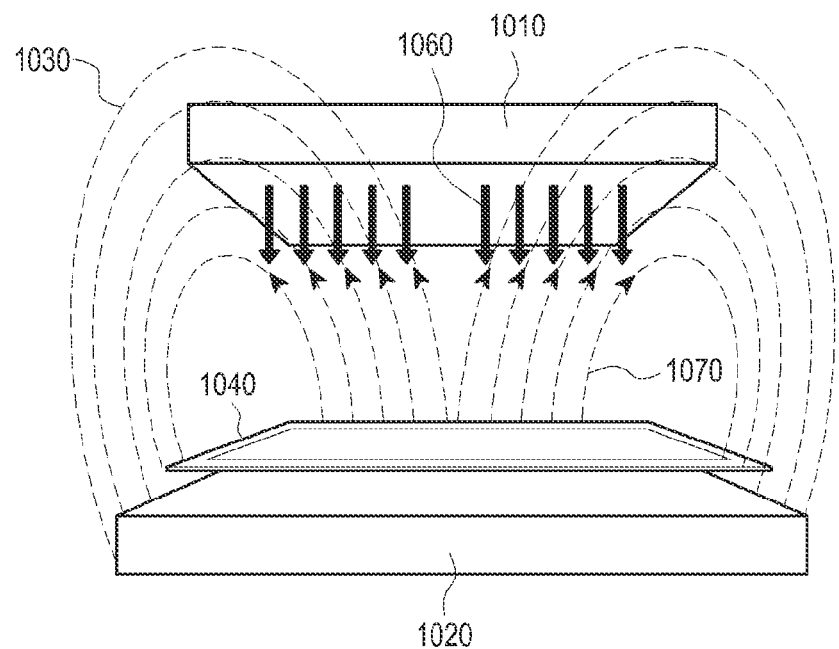
FIG. 10 is an illustration of a change in magnetic field in an antenna according to an embodiment of the present disclosure.

FIG. 10 is an illustration of a change in magnetic field in an antenna pattern 1040 according to an embodiment of the present disclosure.

Referring to FIG. 10, the antenna pattern 1040 may be disposed on a metal shield 1020 and a magnetic field (magnetic fluxes) 1070 may be formed. If an object 1010 disturbs the magnetic fluxes, such as when the user's finger or a metallic material is brought close to the antenna pattern 1040, a reverse magnetic field 1060 for the magnetic field 1070 may be formed. Due to the reverse magnetic field 1060, the magnetic fluxes of the magnetic field 1070 may be reduced.

Due to a reduction of the magnetic fluxes of the magnetic field 1070, the current flowing in the antenna pattern 1040 is reduced, and thus, a voltage applied across opposite ends of a current accumulation module connected to the opposite ends of the antenna pattern 1040 may be reduced. The voltage applied across the opposite ends of the current accumulation module may be converted into a direct current, input to an analog-to-digital converter (ADC) module, converted into digital data, and detected by a control module. The control module may determine which voltage level the detected voltage corresponds to among the predetermined voltage levels.

According to an embodiment of the present disclosure, the predetermined voltage levels may include at least one of a voltage level corresponding to a state where no object is brought close to the electronic device 101, a voltage level corresponding to a state where the electronic device 101 is gripped by a user's hand, a voltage level corresponding to a case where a metallic material is brought close to the electronic device 101, and a voltage level corresponding to a case where an object, having an influence on the magnetic field, other than a hand or a metallic material, is brought close to the electronic device 101.

According to an embodiment of the present disclosure, the voltage levels may be classified according to a state where the electronic device 101 is gripped by a hand. For example, the voltage levels may include at least one of a voltage level corresponding to a state where the electronic device 101 is gripped by some fingers, a voltage level corresponding to state where the electronic device 101 is weakly gripped by a hand, and a voltage level corresponding to a state where the electronic device 101 is strongly gripped by a hand. According to an embodiment of the present disclosure, a wireless communication module for grip sensing may be implemented using an NFC module. An NFC antenna pattern (hereinafter, referred to as an "NFC antenna") may be easy to use as an antenna pattern for use in grip sensing. The NFC antenna is in a form of a loop antenna. Upon being attached to the electronic device 101, the NFC antenna may form a larger magnetic field than any other antenna, for example, a radio frequency (RF) antenna, around the electronic device 101. Since the change amount of the magnetic field is large, the change of the magnetic field may be easily sensed.

Figure 11:
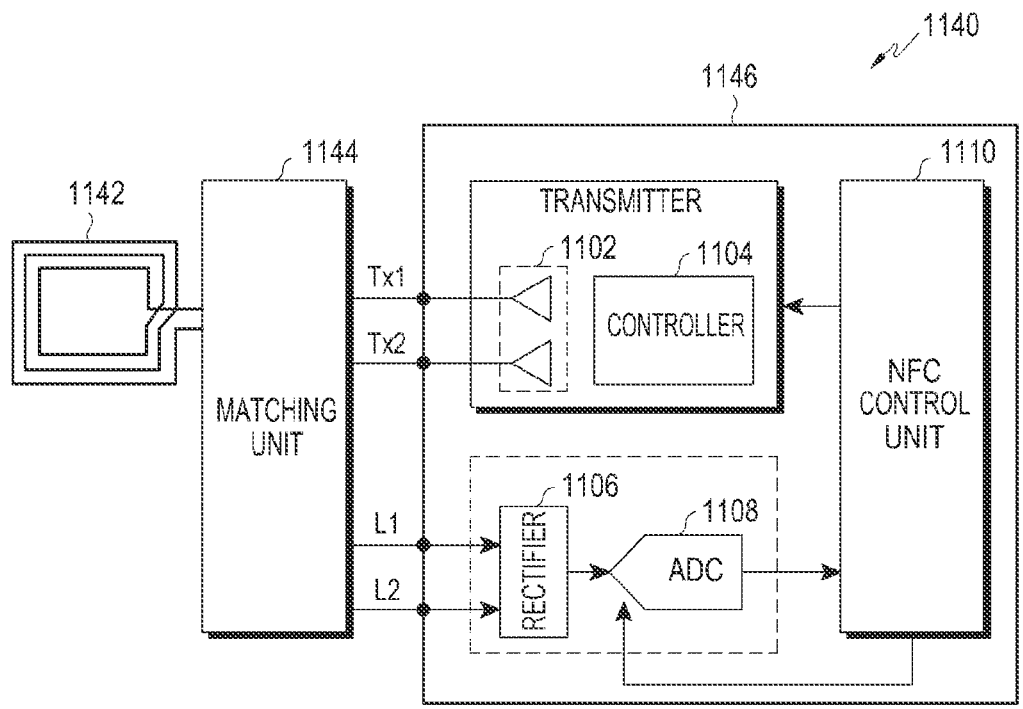
FIG. 11 is a block diagram of an NFC module according to an embodiment of the present disclosure.

FIG. 11 is a block diagram of an NFC module 1140 according to an embodiment of the present disclosure.

Referring to FIG. 11, the NFC module 1140 may include an NFC antenna 1142, a matching unit 1144, and an NFC IC 1146.

The NFC module 1140 further includes an $R_X$ circuit 1330.

The NFC antenna 1142 may be a loop antenna. The NFC antenna 1142 may be a radiator that resonates in a predetermined frequency band and has a power feeding unit and a ground. The opposite ends of the NFC antenna 1142 may be connected to the matching unit 1144. According to an embodiment of the present disclosure, the predetermined frequency band may be an NFC frequency band that is 13.56 MHz. Between the NFC antenna 1142 and the matching unit 1144, an alternating current according to transmission/reception of an NFC signal may flow or an alternating current due to grip may flow.

The matching unit 1144 may match the impedance of the NFC antenna 1142 and the impedance of the NFC IC 1146 so as to reduce signal loss and improve an NFC signal delivery characteristic. An improvement of the signal delivery characteristic may improve communication quality. In other words, the matching unit 1144 may match the impedance of the NFC antenna 1142 and the impedance of the NFC IC 1146, thereby enabling transmission/reception of a wireless frequency signal of the NFC frequency band.

The NFC IC 1146 may receive and process a reception signal of the NFC frequency band which is received through the matching unit 1144, and perform a process such that a transmission signal of the NFC frequency band is transmitted. When a movement of the electronic device 101 is detected, the NFC IC 1146 may be electrically connected to the opposite ends of the NFC antenna 1142 so as to detect a voltage applied across the opposite ends of the circuit that accumulates the alternating current from the NFC antenna 1142, and may determine whether the detected voltage corresponds to a predetermined gripped state voltage. The NFC IC 1146 may include an amplifier 1102, a transmission controller 1104, a rectifier 1106, an ADC 1108, and an NFC control unit 1110. The NFC control unit 1110 may perform the overall control operation of the NFC IC 1146.

The NFC control unit 1110 may process a transmission signal to perform a control such that the transmission controller 1104 transmits the signal, perform a control such that a received signal is processed, and determine whether the electronic device 101 is in a gripped state. When transmitting the signal, the transmission controller 1104 may generate the transmission signal, and the amplifier 1102 may amplify the generated transmission signal and deliver the amplified transmission signal to the matching unit 1144. When receiving a signal, the rectifier 1106 may convert an alternating current delivered from the matching unit 1144 into a DC current, and the ADC 1108 may convert the DC current into a digital code and output the digital code to the NFC control unit 1110.

When determining whether the electronic device 101 is in a gripped state, the NFC control unit 1110 detects a voltage applied between L1 and ground (GND) and a voltage applied between L2 and GND. When the range of the voltage applied between L1 and GND and the voltage applied between L2 and GND corresponds to the voltage level of the gripped state among the plurality of predetermined voltage levels, the state of the electronic device 101 is processed as the gripped state, and when the range of the voltage applied between L1 and GND and the voltage applied between L2 and GND does not correspond to the voltage level of the gripped state, the state of the electronic device 101 may be processed as the non-gripped state. According to an embodiment of the present disclosure, the current flowing in L1 or L2 is an alternating current and may fluctuate between a positive or plus (+) value and a negative or minus (−) value with reference to GND. As a result, the values of the voltage applied between L1 and GND and the voltage applied between L2 and GND may also fluctuate between a plus (+) voltage and a minus (−) voltage. According to an embodiment of the present disclosure, when the voltage applied between L1 and GND is 4.52V, and the voltage applied between L2 and GND is −4.52V so that the range of the voltage applied between L1 and GND and the voltage applied between L2 and GND is 9.04V, it may be determined that the electronic device 101 is in a state before being gripped. According to an embodiment of the present disclosure, when the voltage applied between L1 and GND is 2.44V and the voltage applied between L2 and GND is −2.44V so that the range of the voltage applied between L1 and GND and the voltage applied between L2 and GND is 4.88V, it may be determined that the electronic device 101 is in a state after being gripped.

According to an embodiment of the present disclosure, the NFC control unit 1110 may determine whether the range of the voltage applied between L1 and GND and the voltage applied between L2 and GND corresponds to a voltage level of a state where the electronic device 101 is gripped by some fingers, in a voltage level of a state where the electronic device 101 is weakly gripped by a hand, or in a voltage level of a state where the electronic device 101 is strongly gripped by a hand.

According to an embodiment of the present disclosure, a plurality of predetermined voltage levels may include at least one of a voltage level in a state where no object is brought close to the electronic device 101, a voltage level corresponding to a state where the electronic device 101 is gripped by a user's hand, a voltage level corresponding to a case where a metallic material is brought close to the electronic device 101, and a voltage level corresponding to a case where an object, having an influence on a magnetic field, other than a hand or a metallic material, is brought close to the electronic device 101. According to an embodiment of the present disclosure, a plurality of predetermined voltage levels may include at least one of a voltage level corresponding to a state where the electronic device 101 is gripped by some fingers as well as a hand, a voltage level corresponding to a state where the electronic device 101 is weakly gripped by a hand, and a voltage level corresponding to a state where the electronic device 101 is strongly gripped by a hand.

Figure 12:
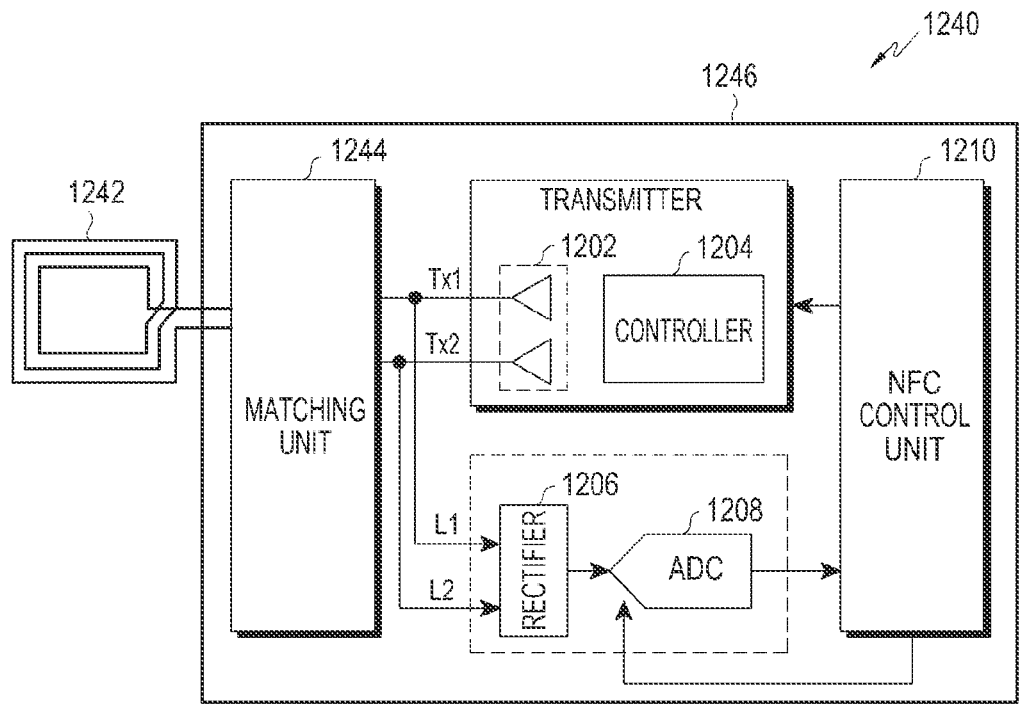
FIG. 12 is a block diagram of an NFC module in a case where a matching unit is included in an NFC IC according to an embodiment of the present disclosure.

FIG. 12 is a block diagram of an NFC module 1240 in a case where a matching unit 1244 is included in an NFC IC 1246 according to an embodiment of the present disclosure. According to an embodiment of the present disclosure, the matching unit 1244 may be included in the NFC IC 1246.

Figure 13:
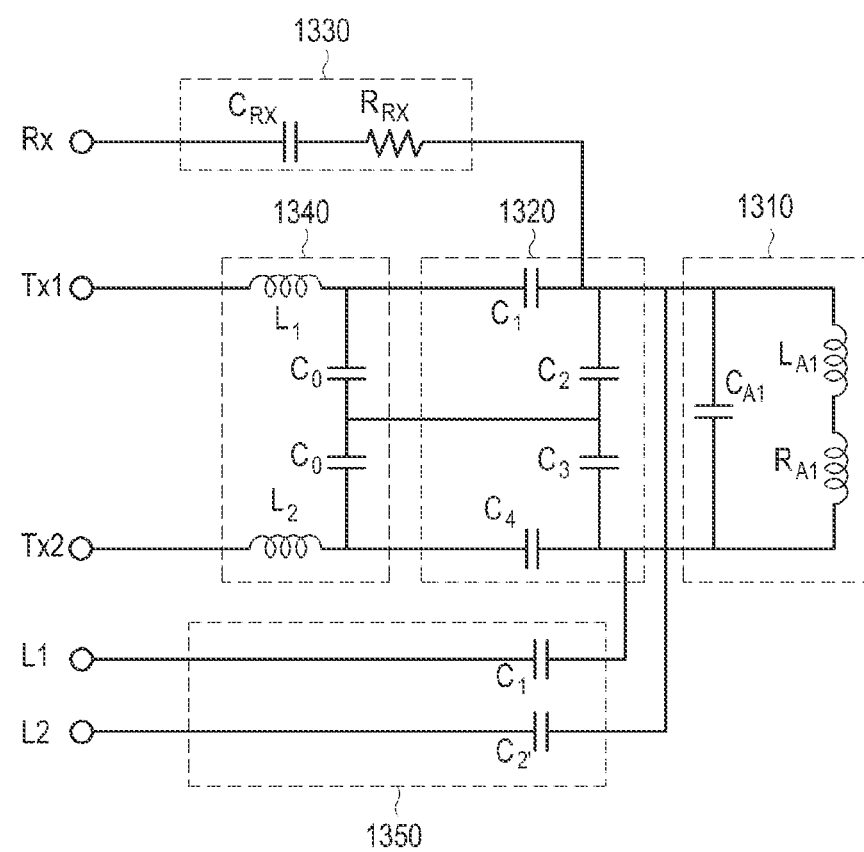
FIG. 13 is a schematic diagram of a circuit of an NFC module according to an embodiment of the present disclosure.

Referring to FIG. 12, the NFC IC 1246 may include the matching unit 1244, an amplifier 1202, a controller 1204, a rectifier 1206, an ADC 1208, and an NFC control unit 1210. The matching unit 1244 may be included in the NFC IC 1246 to perform impedance matching within the NFC IC 1246. The amplifier 1202, the controller 1204, the rectifier 1206, the ADC 1208, and the NFC control unit 1210 may perform the operations described above with reference to FIG. 11. The NFC module 1240 further includes an $R_X$ circuit 1330. FIG. 13 is a schematic diagram of a circuit of an NFC module according to an embodiment of the present disclosure.

Referring to FIG. 13, the NFC module may include an NFC antenna circuit 1310, a matching circuit 1320, an $R_X$ circuit 1330, an electromagnetic compatibility (EMC) filter circuit 1340, and a card mode circuit (current accumulation circuit) 1350.

The NFC antenna circuit 1310 may include an inductance element $L_{A1}$ and a resistance element $R_{A1}$ which are connected in series, and a capacitance element $C_{A1}$ connected to the inductance element $L_{A1}$ and the resistance element $R_{A1}$ in parallel. The NFC antenna circuit 1310 may resonate in a predetermined frequency band, and is connected to the matching circuit 1320 at the opposite ends thereof.

The matching circuit 1320 may include one or more capacitances $C_1$, $C_2$, $C_3$ and $C_4$ may match the impedance of the NFC antenna circuit 1310 and the impedance of the Rx circuit 1330 and the EMC filter circuit 1340 so as to reduce a signal loss and improve an NFC signal delivery characteristic. The improvement of the signal delivery characteristic may improve communication quality. In other words, the matching circuit 1320 may match the impedance of the NFC antenna circuit 1310 and the impedance of the Rx circuit 1330 and the EMC filter circuit 1340, thereby enabling transmission/reception of a wireless frequency signal of the NFC frequency band.

The Rx circuit 1330 may include a capacitance $C_{RX}$ and a resistance $R_{RX}$ which are connected in series, and may receive a signal delivered by the resonance of the NFC antenna circuit 1310.

The EMC filter circuit 1340 may include at least one inductance $L_1$ and at least one capacitance $C_0$, and may remove a high frequency component at the time of transmitting a Tx signal.

The card mode circuit 1350 may be connected to the opposite ends of the NFC antenna circuit 1310, and may include at least one capacitance $C_{2'}$. When the NFC module is operated in a card mode, information may be read from or written to the NFC module by an external card reader. According to an embodiment of the present disclosure, the card mode circuit 1350 is connected to the opposite ends of the NFC antenna circuit 1310 and may accumulate an alternating current by the NFC antenna circuit 1310 through the at least one capacitance $C_{2'}$. As a result, a voltage may be applied between the opposite ends of the card mode circuit 1350. According to an embodiment of the present disclosure, the range of the voltage applied between L1 and GND and the voltage applied between L2 and GND, that is, the difference between the voltage applied between L1 and GND and the voltage applied between L2 and GND may be detected. According to an embodiment of the present disclosure, the voltage applied between the opposite ends of the card mode circuit 1350 may change according to the change in magnetic field which is caused as an object is brought close to the NFC antenna circuit 1310.

Figure 14:
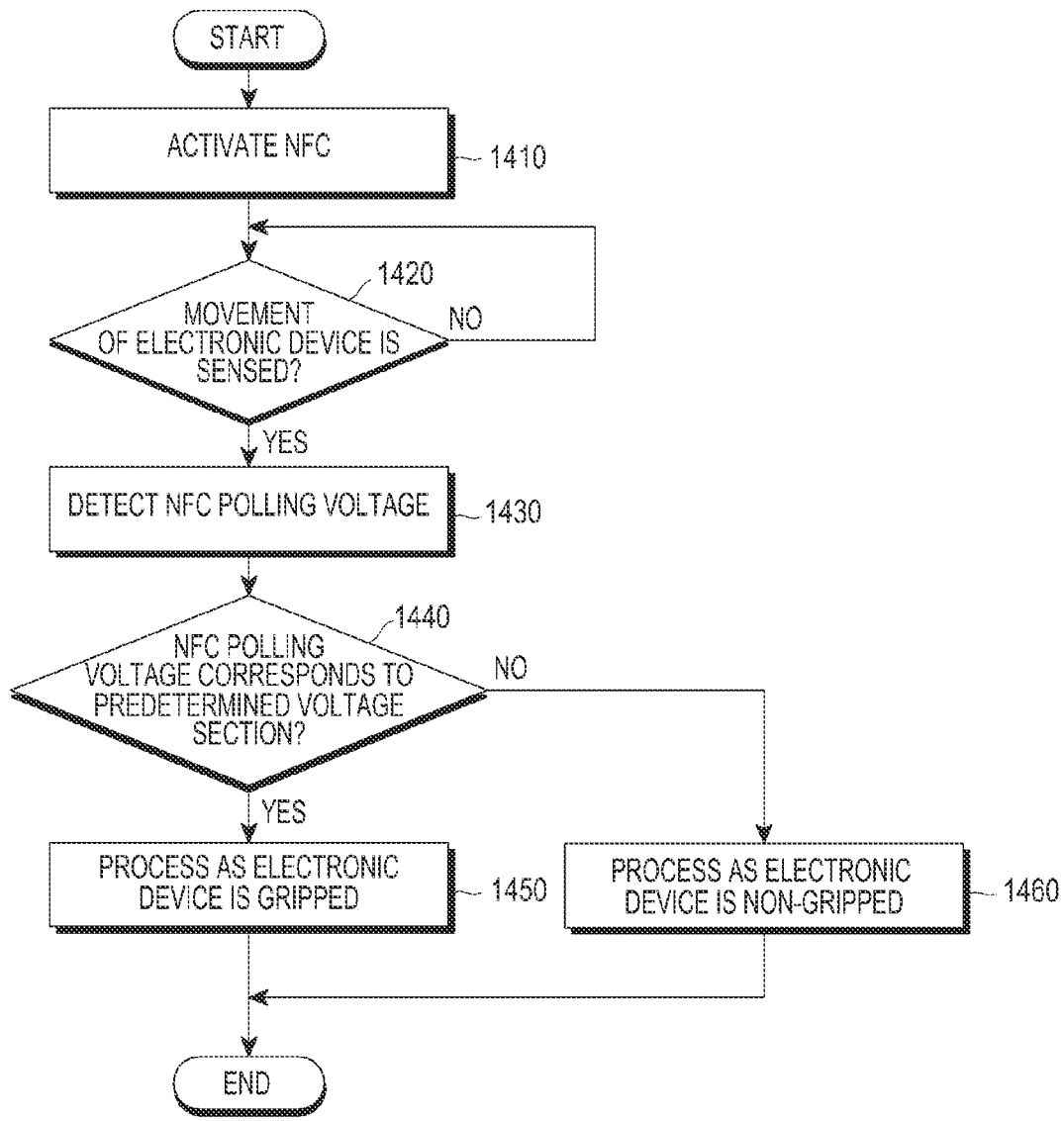
FIG. 14 is a flowchart of a grip sensing method of an electronic device according to an embodiment of the present disclosure.

FIG. 14 is a flowchart of a grip sensing method of an electronic device according to an embodiment of the present disclosure.

Referring to FIG. 14, the electronic device 101 may activate an NFC in step 1410. For example, when power is turned on, the electronic device 101 may activate an NFC module. In another example, when an event (e.g., reception of a phone call, reception of a text message, or reception of a notification) occurs, the electronic device 101 may activate an NFC module.

In step 1420, the electronic device 101 may determine whether a movement of the electronic device 101 is sensed. According to an embodiment of the present disclosure, the electronic device 101 may determine whether the electronic device 101 moves by using an acceleration sensor and a terrestrial magnetism sensor.

When movement of the electronic device 101 is sensed, in step 1430, an NFC polling voltage may be detected. According to an embodiment of the present disclosure, an NFC control unit of the electronic device 101 may detect a voltage applied between opposite ends of a card mode circuit 1350, which are connected to the opposite ends of an NFC antenna circuit 1310, respectively, in a polling manner according to a predetermined time interval or sequence. According to an embodiment of the present disclosure, the electronic device 101 may check the voltage applied between L1 and GND and the voltage applied between L2 and GND, for example, per every 0.5 seconds, and detect the voltage applied between the opposite ends of the card mode circuit 1350 with reference to the difference between the measured voltage applied between L1 and GND and the measured voltage applied between L2 and GND.

In step 1440, the electronic device 101 may determine whether the voltage measured through the NFC polling corresponds to a predetermined voltage section. According to an embodiment of the present disclosure, the predetermined voltage section may be a gripped state voltage section. According to an embodiment of the present disclosure, the gripped state voltage section may be a section in which a voltage applied between the opposite ends of the card mode circuit 1350, which are connected to the opposite ends of the NFC antenna circuit 1310, respectively, when a user's hand is brought close to or brought into contact with the NFC antenna circuit 1310 to be in the gripped state. According to an embodiment of the present disclosure, the gripped state voltage may be a voltage reduced by a predetermined range of voltages from the voltage at a default state. According to an embodiment of the present disclosure, the gripped state voltage may be a voltage reduced by −3.5V to −5.5V from the voltage of the default state. In addition, the predetermined range of voltages may have any other value depending on a voltage measuring method and a voltage measuring position.

When the voltage measured through the NFC polling corresponds to the predetermined voltage section, the electronic device 101 may process the state of the electronic device 101 as a gripped state in step 1450. In addition, when the voltage measured through the NFC polling does not correspond to the predetermined voltage section, the electronic device 101 may process the state of the electronic device 101 as a non-gripped state in step 1460.

Figure 15:
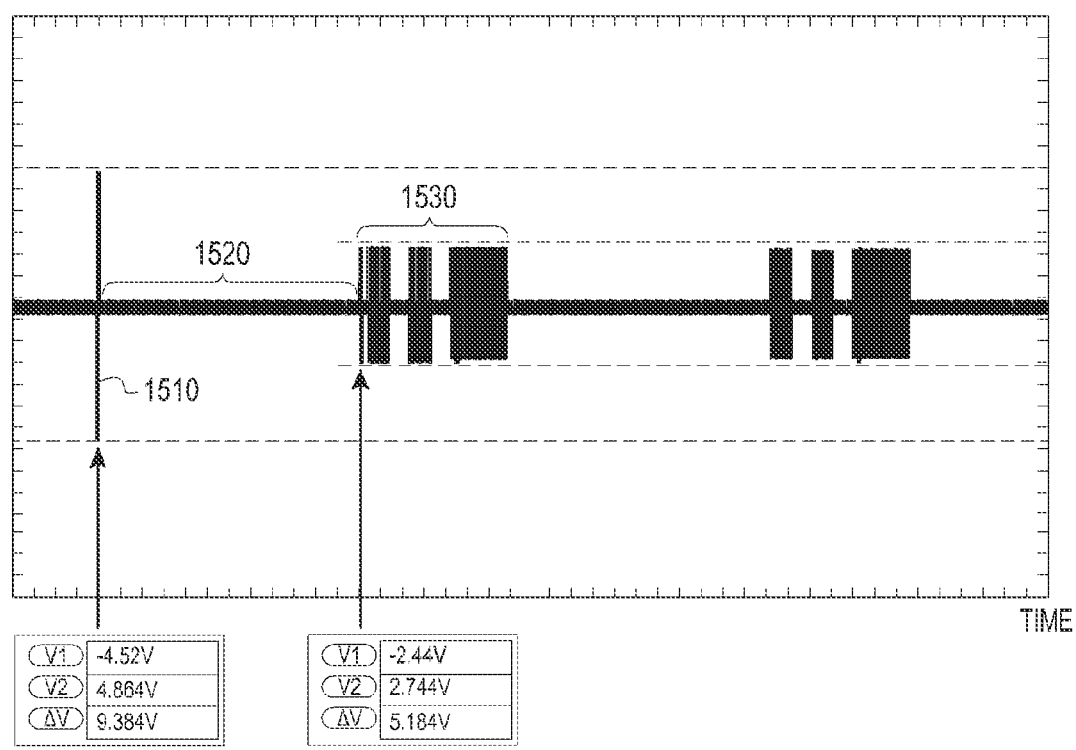
FIGS. 15 to 17 are charts of changes between a voltage applied between L1 and GND and a voltage applied between L2 and GND in an NFC module according to an embodiment of the present disclosure.
Figure 16:
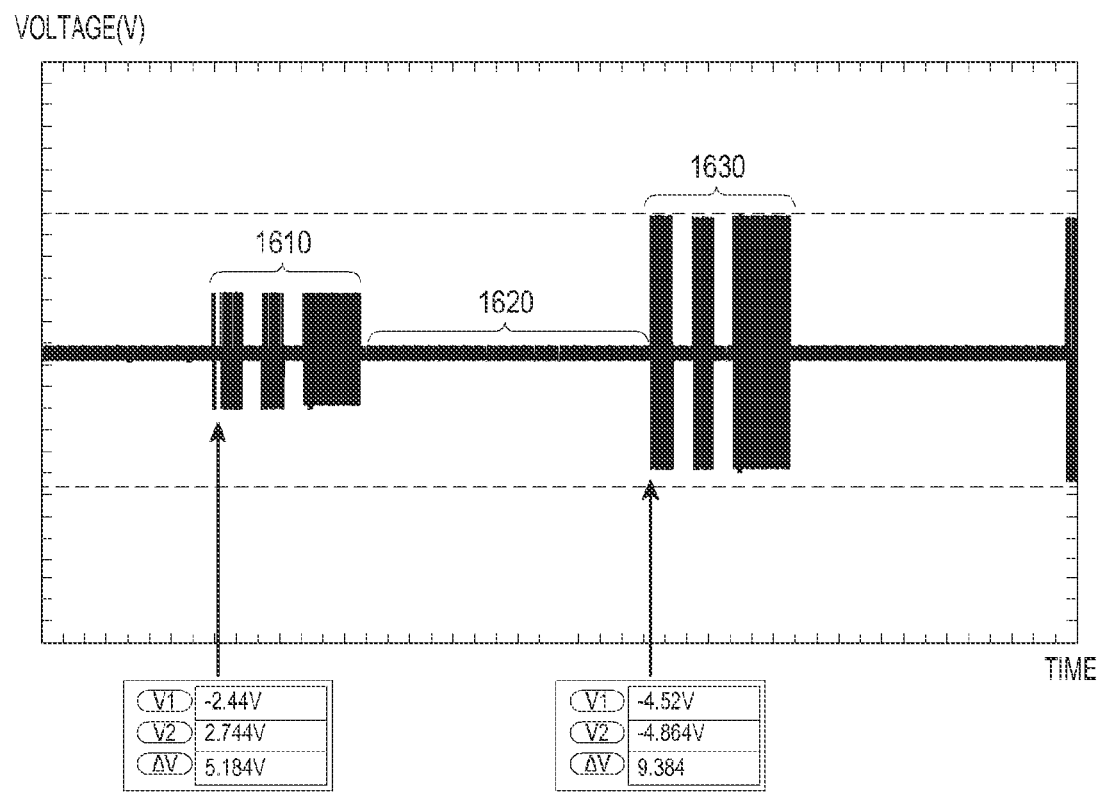
Figure 17:
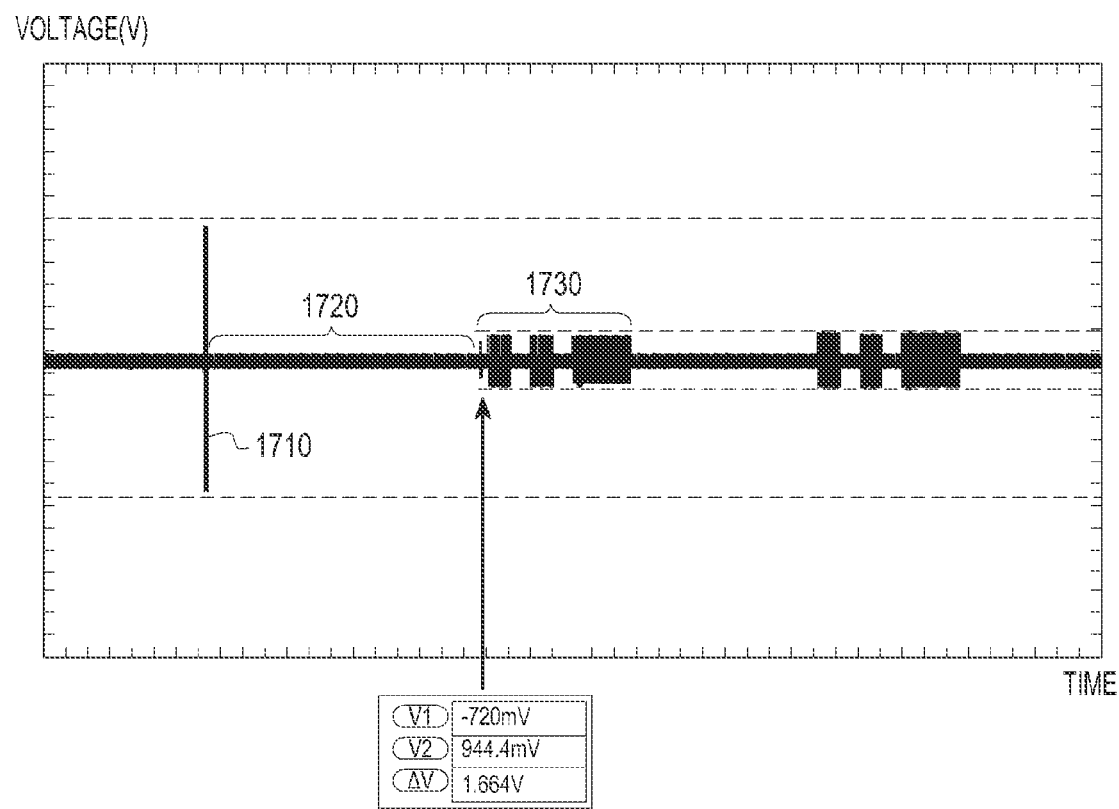

FIGS. 15 to 17 are charts of changes between the voltage applied between L1 and GND and a voltage applied between L2 and GND in an NFC module according to an embodiment of the present disclosure.

Referring to FIG. 15, the vertical axis represent voltage (V) and the horizontal axis represents time (t). FIG. 15 illustrates a change between a voltage applied between L1 and GND and a voltage applied between L2 and GND according to time.

In a default state (e.g., a state where the magnetic field is not influenced) 1510, the NFC module 1240 may transmit a transmission signal to a maximum so as to recognize an external tag. As a result, the difference between the voltage applied between L1 and GND and the voltage applied between L2 and GND may become the maximum. According to an embodiment of the present disclosure, in the default state 1510, the difference between the voltage applied between L1 and GND and the voltage applied between L2 and GND may be about 9V (e.g., ΔV=9.384V).

After checking the voltage of the default state 1510, the NFC module 1240 may re-check each of the voltage applied between L1 and GND and the voltage applied between L2 and GND after a predetermined length of time (e.g., after 0.5 seconds) by the polling method. When the electronic device 101 is gripped by the user in the section indicated by reference numeral 1520 and thus, the electronic device 101 is in the gripped state, the difference between the voltage applied between L1 and GND and the voltage applied between L2 and GND may be reduced. According to an embodiment of the present disclosure, in the gripped state 1530, the difference between the voltage applied between L1 and GND and the voltage applied between L2 and GND may be about 5V (e.g., $\Delta V=5.184V$). When the difference between the voltage applied between L1 and GND and the voltage applied between L2 and GND corresponds to the predetermined gripped state voltage, the NFC module 1240 may process the state of the electronic device 101 as the gripped state.

Referring to FIG. 16, after checking the voltage in the gripped state 1610, the NFC module 1240 may re-check the difference between the voltage applied between L1 and GND and the voltage applied between L2 and GND after a predetermined length of time (e.g., after 0.5 seconds) by the polling method. According to an embodiment of the present disclosure, in the gripped state 1610, the difference between the voltage applied between L1 and GND and the voltage applied between L2 and GND may be about 5V (e.g., $\Delta V=5.184V$).

If the electronic device 101 is released from the gripped state by the user in the section indicated by reference numeral 1620 and thus, the electronic device 101 is in the non-gripped state, the difference between the voltage applied between L1 and GND and the voltage applied between L2 and GND may return to the voltage of the default state indicated by reference numeral 1630. According to an embodiment of the present disclosure, in the default state 1630, the difference between the voltage applied to L1 and GND and the voltage applied between L2 and GND may be about 9V (e.g. $\Delta V=9.384V$). When the difference between the voltage applied between L1 and GND and the voltage applied between L2 and GND does not belong to a set gripped state voltage, the NFC module 1240 may process the state of the electronic device 101 as the non-gripped state.

Referring to FIG. 17, after checking the voltage in the default state 1710, the NFC module 1240 may re-check the difference between the voltage applied between L1 and GND and the voltage applied between L2 and GND after a predetermined length of time (e.g., after 0.5 seconds) by the polling method. If the electronic device 101 is brought close to an object of a metallic material, the difference between the voltage applied between L1 and GND and the voltage applied between L2 and GND may become lower than the voltage of the user's grip in the section indicated by reference numeral 1720. According to an embodiment of the present disclosure, the difference between the voltage applied between L1 and GND and the voltage applied between L2 and GND in the state where the object of the metallic material is brought close to the electronic device 101 as indicated by reference numeral 1730 may be about 1.5V (e.g., $\Delta V=1.664V$). In the case where the metallic material is brought close to the electronic device 101 or an object of any other material other than a hand is brought close to the electronic device 101 and the difference between the voltage applied between L1 and GND and the voltage applied between L2 and GND does not belong to a set gripped state voltage, the NFC module 1240 may process the state of the electronic device 101 as the non-gripped state.

According to an embodiment of the present disclosure, there is provided a grip sensing method in an electronic device. The method may include a process of supplying a current to an antenna pattern; a process of detecting a current and/or a voltage by an electromagnetic field or a magnetic field formed by the antenna pattern as the current is supplied; and a process of determining whether the electronic device is gripped based on the detected current and/or the detected voltage.

According to an embodiment of the present disclosure, the antenna pattern may be a loop antenna pattern. According to an embodiment of the present disclosure, the antenna pattern may be an NFC antenna pattern.

According to an embodiment of the present disclosure, the process of determining whether the electronic device is gripped may include determining that the electronic device is in a gripped state when the detected voltage belongs to a voltage level corresponding to a gripped state; and determining that the electronic device is in a non-gripped state when the detected voltage does not belong to the voltage level corresponding to the gripped state.

According to an embodiment an embodiment of the present disclosure, the method may further include a process of determining that the gripped state of the electronic device is released when the detected voltage is recovered to a default state from a state where the electronic device is gripped.

According to an embodiment of the present disclosure, the current may be supplied to the antenna pattern according to a predetermined period.

According to an embodiment of the present disclosure, the predetermined period may be changed to any one of a first period and a second period depending on whether the display unit is turned on or turned off. According to an embodiment of the present disclosure, the predetermined period may be changed to any one of a first period and a second period depending on whether the electronic device moves.

According to an embodiment of the present disclosure, the method may further include a process of determining which voltage level the detected voltage corresponds to among a plurality of predetermined voltage levels.

According to an embodiment of the present disclosure, the plurality of predetermined voltage levels may include at least one of a voltage level in a state where no object is brought close to the electronic device; a voltage level corresponding to a state where the electronic device is gripped; a voltage level corresponding to a case where a metallic material is brought close to the electronic device; and a voltage level corresponding to a case where an object, having an influence on a magnetic field, other than a hand and a metallic material, is brought close to the electronic device.

According to an embodiment of the present disclosure, the plurality of predetermined voltage levels may include at least one of a voltage level corresponding to a state where a part of a finger is touched on the electronic device; a voltage level corresponding to a state where the electronic device is gripped weakly; and a voltage level corresponding to a state where the electronic device is gripped strongly.

According to an embodiment of the present disclosure, the voltage level corresponding to the gripped state may be a voltage reduced from a voltage of a default state within a predetermined voltage level range.

Figure 18:
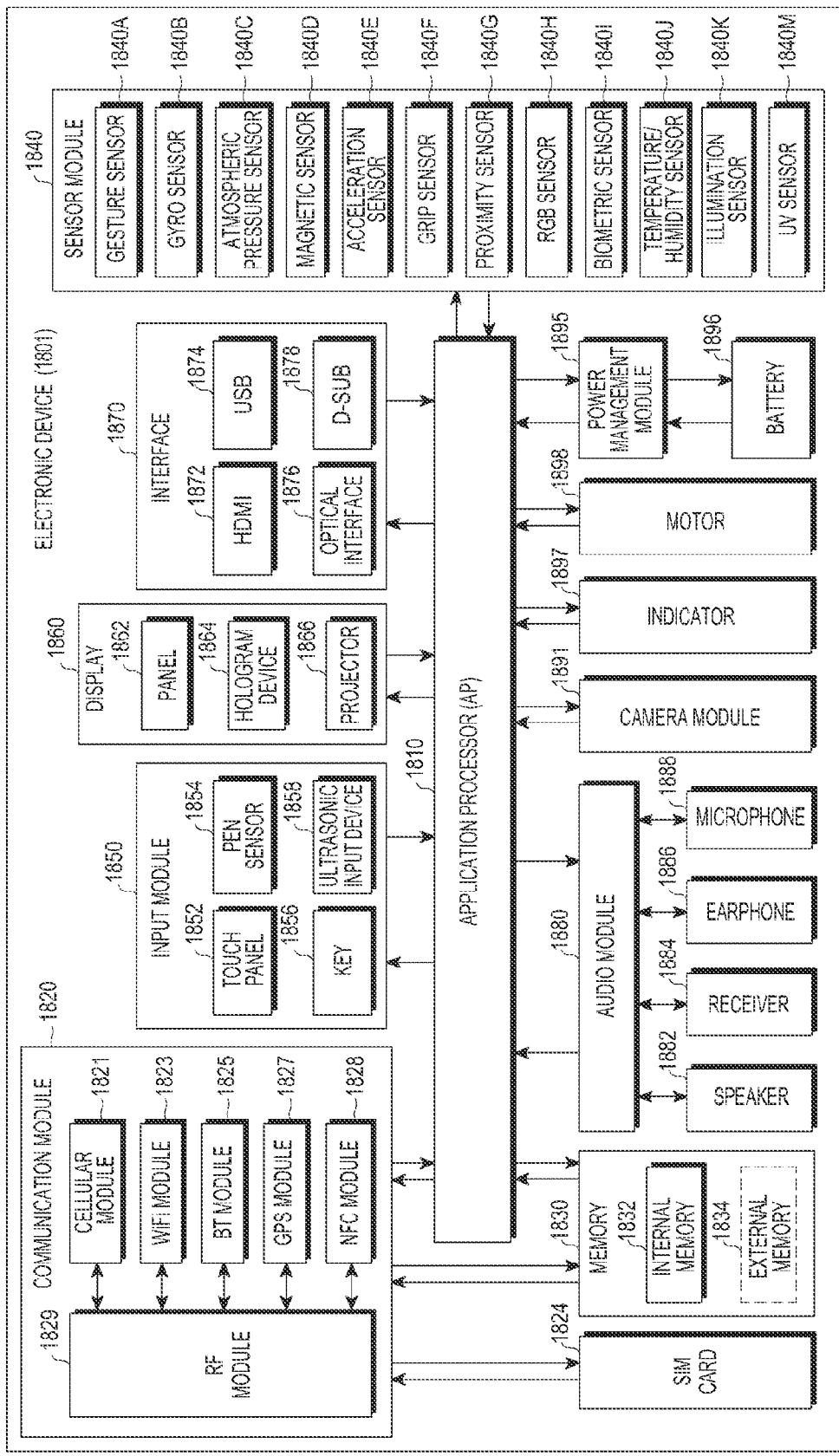
FIG. 18 is a block diagram of an electronic device according to an embodiment of the present disclosure.

FIG. 18 is a block diagram illustrating an electronic device 1801 according to various embodiments of the present disclosure. The electronic device 1801 may form, for example, the whole or a part of the electronic device 101 illustrated in FIG. 1.

Referring to FIG. 18, the electronic device 1801 may include at least one application processor (AP) 1810, a communication module 1820, a subscriber identification module (SIM) card 1824, a memory 1830, a sensor module 1840, an input module 1850, a display 1860, an interface 1870, an audio module 1880, a camera module 1891, a power management module 1895, a battery 1896, an indicator 1897, and a motor 1898.

The AP 1810 may drive an operating system or applications so as to control a plurality of hardware or software components connected thereto, and may also perform processing and arithmetic operation for various data including multimedia data. The AP 1810 may be implemented by a system-on-chip (SoC), for example. According to an embodiment of the present disclosure, the AP 1810 may further include a graphics processing unit (GPU).

The communication module 1820 (e.g., the communication interface 160) may perform data transmission/reception in the communication performed among other electronic devices (e.g., the electronic device 104 or the server 106) connected to the electronic device 1801 (e.g., the electronic device 101) through the network. According to an embodiment of the present disclosure, the communication module 1820 may include a cellular module 1821, a WiFi module 1823, a BT module 1825, a GPS module 1827, an NFC module 1828, and an RF module 1829.

The cellular module 1821 may support, for example, a voice call, a video call, a message service, or an internet service through a communication network (e.g., LTE, LTE-A, CDMA, WCDMA, UMTS, WiBro, or GSM). In addition, the cellular module 1821 may perform identification and authentication of the electronic device in the communication network, using the SIM card 1824, for example. According to an embodiment of the present disclosure, the cellular module 1821 may perform at least some of the functions that may be provided by the AP 1810. For example, the cellular module 1821 may perform at least some multimedia control functions.

According to an embodiment of the present disclosure, the cellular module 1821 may include a communication processor (CP). In addition, the cellular module 1821 may be implemented by an SoC, for example. FIG. 18 illustrates some components, such as the cellular module 1821 (e.g., the CP), the memory 1830, and the power management module 1895 as being separate from the AP 1810. However, the AP 1810 may be implemented to include at least some (e.g., the cellular module 1821) of the above-mentioned components in an embodiment of the present disclosure.

According to an embodiment of the present disclosure, the AP 1810 and the cellular module 1821 (e.g., the CP) may load commands or data, received from at least one of nonvolatile memories or other components connected to each of them, into a volatile memory to process them. In addition, the AP 1810 or the cellular module 1821 may store data, received from or created by at least one of the other components, in the nonvolatile memory.

Each of the WiFi module 1823, the BT module 1825, the GPS module 1827, and the NFC module 1828 may include, for example, a processor for processing data transmitted/received therethrough. FIG. 18 illustrates the cellular module 1821, the WiFi module 1823, the BT module 1825, the GPS module 1827, and the NFC module 1828 as separate blocks. However, at least some (e.g., two or more) of them may be incorporated in a single IC or a single IC package in an embodiment of the present disclosure. For example, at least some of the respective processors corresponding to the cellular module 1821, the WiFi module 1823, the BT module 1825, the GPS module 1827, and the NFC module 1828 (e.g., the CP corresponding to the cellular module 1821 and a WiFi processor corresponding to the WiFi module 1823), may be implemented by a single SoC.

The RF module 1829 may perform data transmission/reception, e.g., RF signal transmission/reception. The RF module 1829 may include, for example, a transceiver, a power amplifier module (PAM), a frequency filter, or a low noise amplifier (LNA). Also, the RF module 1829 may further include any component, e.g., a wire or a conductor, for transmission/reception of electromagnetic waves in free air in a wireless communication. FIG. 18 illustrates that the cellular module 1821, the WiFi module 1823, the BT module 1825, the GPS module 1827 and the NFC module 1828 share the RF module 1829. According to an embodiment of the present disclosure, however, at least one of them may perform RF signal transmission/reception through a separate RF module.

The SIM card 1824 may be inserted into a slot formed at a certain position in the electronic device. The SIM card 1824 may contain unique identification information (e.g., an integrated circuit card identifier (ICCID) or subscriber information (e.g., international mobile subscriber identity (IMSI).

The memory 1830 (e.g., the memory 130) may include an internal memory 1832 or an external memory 1834. The internal memory 1832 may include, for example, at least one of a volatile memory (e.g., dynamic random access memory (DRAM), static RAM (SRAM), or synchronous DRAM (SDRAM)) and a nonvolatile memory (e.g., one-time programmable read only memory (OTPROM), programmable ROM (PROM), erasable PROM (EPROM), electrically erasable PROM (EEPROM), mask ROM, flash ROM, NAND flash memory, or NOR flash memory).

According to an embodiment of the present disclosure, the internal memory 1832 may have the form of a solid state device (SSD). The external memory 1834 may further include a flash drive, e.g., compact flash (CF) drive, secure digital (SD) drive, micro SD (Micro-SD) drive, mini SD (Mini-SD) drive, extreme digital (xD) drive, or a memory stick. The external memory 1834 may be functionally connected to the electronic device 1801 through various interfaces. According to an embodiment of the present disclosure, the electronic device 1801 may further include a storage device (or a storage medium) such as a hard drive.

The sensor module 1840 may measure physical quantity or sense an operating status of the electronic device 1801, and then convert measured or sensed information into electrical signals. The sensor module 1840 may include, for example, at least one of a gesture sensor 1840A, a gyro sensor 1840B, an atmospheric pressure sensor 1840C, a magnetic sensor 1840D, an acceleration sensor 1840E, a grip sensor 1840F, a proximity sensor 1840G, a color sensor 1840H (e.g., red-green-blue (RGB) sensor), a biometric sensor 1840I, a temperature/humidity sensor 1840J, an illumination sensor 1840K, and a ultraviolet (UV) light sensor 1840M. Additionally or alternatively, the sensor module 1840 may include, for example, an electronic nose (E-nose sensor), an electromyography (EMG) sensor, an electroencephalogram (EEG) sensor, an electrocardiogram (ECG) sensor, an infrared (IR) sensor, an iris scan sensor, or a finger scan sensor. The sensor module 1840 may further include a control circuit for controlling one or more sensors incorporated therein.

The input module 1850 may include a touch panel 1852, a (digital) pen sensor 1854, a key 1856, or an ultrasonic input device 1858. The touch panel 1852 may recognize a touch input by, for example, at least one of capacitive type, resistive type, infrared type, and ultrasonic type. Also, the touch panel 1852 may further include a control circuit. The capacitive type may recognize a physical contact or a proximity of a touch. The touch panel 1852 may further include a tactile layer. In this case, the touch panel 1852 may provide a tactile reaction to a user.

The (digital) pen sensor 1854 may be implemented in the same or similar manner as receiving a touch input or by using a separate recognition sheet. The key 1856 may include, for example, a physical button, an optical key, or a keypad. The ultrasonic input device 1858 is a device capable of identifying data by sensing sound waves with a microphone 1888 in the electronic device 1801 through an input tool that generates ultrasonic signals, thus allowing wireless recognition. According to an embodiment of the present disclosure, the electronic device 1801 may receive a user input from any external device (e.g., a computer or a server) connected thereto through the communication module 1820.

The display 1860 (e.g., the display 150) may include a panel 1862, a hologram device 1864, or a projector 1866. The panel 1862 may be, for example, a liquid crystal display (LCD) or an active matrix organic light emitting diode (AM-OLED). The panel 1862 may be implemented to be flexible, transparent or wearable. The panel 1862 may be configured as a single module with the touch panel 1852. The hologram device 1864 may show a stereoscopic image in the air using the interference of light. The projector 1866 may project an image onto a screen. The screen may be located internally or externally to the electronic device 1801. According to an embodiment of the present disclosure, the display 1860 may further include a control circuit for controlling the panel 1862, the hologram device 1864, or the projector 1866.

The interface 1870 may include, for example, a high-definition multimedia interface (HDMI) 1872, a universal serial bus (USB) 1874, an optical interface 1876, or a D-subminiature (D-sub) connector 1878. The interface 1870 may be included, for example, in the communication interface 160 illustrated in FIG. 1. Additionally or alternatively, the interface 1870 may include, for example, a mobile high-definition link (MHL) interface, a secure digital card/multi-media card (SD/MMC) interface, or an Infrared Data Association (IrDA) standard interface.

The audio module 1880 may bi-directionally convert sounds and electrical signals. At least some components of the audio module 1880 may be included, for example, in the input/output interface 140 illustrated in FIG. 1. The audio module 1880 may process sound information inputted or outputted through a speaker 1882, a receiver 1884, an earphone 1886, or a microphone 1888.

The camera module 1891 is a device capable of photographing a still image and a moving image. According to an embodiment of the present disclosure, the camera module 1891 may include at least one image sensor (e.g., a front sensor or a rear sensor), a lens, an image signal processor (ISP), or a flash (e.g., LED or xenon lamp).

The power management module 1895 may manage electrical power of the electronic device 1801. The power management module 1895 may include, for example, a power management IC (PMIC), a charger IC, or a battery gauge.

The PMIC may be incorporated in, for example, an IC or SoC. Charging may be performed in a wired or wireless manner. The charger IC may charge a battery 1896 and prevent overvoltage or overcurrent from a charger. According to an embodiment of the present disclosure, the charger IC may have a charger IC used for at least one of wired and wireless charging types. The wireless charging type may include, for example, a magnetic resonance type, a magnetic induction type, or an electromagnetic type. Any additional circuit for wireless charging, such as a coil loop, a resonance circuit, or a rectifier, may be further used.

The battery gauge may measure the residual amount of the battery 1896 and a voltage, current, or temperature in a charging process. The battery 1896 may store or create electrical power and supply the electrical power to the electronic device 1801. The battery 1896 may include, for example, a rechargeable battery or a solar battery.

The indicator 1897 may indicate a current status (e.g., a booting status, a message status, or a recharging status) of the electronic device 1801 or a part of the electronic device 1801 (e.g., the AP 1810). The motor 1898 may convert an electrical signal into a mechanical vibration. The electronic device 1801 may include a processor (e.g., GPU) for supporting a mobile TV. The processor for supporting a mobile TV may process media data that complies with standards of, for example, digital multimedia broadcasting (DMB), digital video broadcasting (DVB), or media flow.

The above described components of the electronic device according to an embodiment of the present disclosure may be formed of one or more components, and a name of a corresponding component element may be changed based on the type of electronic device. The electronic device according to the present disclosure may include one or more of the aforementioned components or may further include other additional components, or some of the aforementioned components may be omitted. Further, some of the components of the electronic device according to an embodiment of the present disclosure may be combined to form a single entity, and thus, may equivalently execute functions of the corresponding elements prior to the combination.

The term "module" used in the present disclosure may refer to, for example, a "unit" including one of hardware, software, and firmware, or a combination of two or more of the hardware, software, and firmware. The term "module" may be interchangeable with a term, such as "unit," "logic," "logical block," "component," or "circuit." The term "module" may indicate a minimum unit of an integrated component element or a part thereof. The term "module" may indicate the smallest unit that performs one or more functions or a part thereof. The term "module" may indicate a device that is mechanically or electronically implemented. For example, the "module" according to an embodiment of the present disclosure may include at least one of an application-specific IC (ASIC), a field-programmable gate array (FPGA), and a programmable-logic device (PLD) for performing operations which are known or will be developed.

According to an embodiment of the present disclosure, at least a part of a device (for example, modules or functions thereof) or a method (for example, operations) according to an embodiment of the present disclosure may be embodied by, for example, a command stored in a non-transitory computer readable storage medium in a form of a programming module. When a command is executed by one or more processors (for example, the processor 120), the one or more processors may execute a function corresponding to the command. The non-transitory computer-readable storage medium may be, for example, the memory 130. At least a part of the programming module may, for example, be implemented (e.g., executed) by the processor 120. At least a part of the programming module may, for example, include a module, a program, a routine, a set of instructions, or a process for performing at least one function.

The non-transitory computer readable recording medium may include magnetic media such as a hard disk, a floppy disk, and a magnetic tape, optical media such as a compact disk read only memory (CD-ROM) and a digital versatile disk (DVD), magneto-optical media such as a floptical disk, and hardware devices specifically configured to store and execute program commands, such as a ROM, a RAM, and a flash memory. In addition, the program instructions may include high level language code, which can be executed in a computer by using an interpreter, as well as machine code generated by a compiler. The aforementioned hardware device may be configured to operate as one or more software modules in order to perform the operation of an embodiment of the present disclosure, and vice versa.

A module or a programming module according to the present disclosure may include at least one of the described component elements, a few of the component elements may be omitted, or additional component elements may be included. Operations executed by a module, a programming module, or other component elements according to an embodiment of the present disclosure may be executed sequentially, in parallel, repeatedly, or in a heuristic manner. Further, some operations may be executed according to another order or may be omitted, or other operations may be added.

According to an embodiment of the present disclosure, in a storage medium storing commands therein, the commands are set such that when they are executed by at least one processor, the at least one processor may perform at least one operation. The at least one operation performed by the at least one processor may include an operation of supplying a current to an antenna module according to a predetermined period, an operation of accumulating the current from the antenna module as the current is supplied, and an operation of detecting a voltage according to the accumulated current and determining whether the electronic device is gripped based on the detected voltage.

Embodiments provided in the present disclosure and the accompanying drawings are merely certain examples to readily describe the technology associated with embodiments of the present disclosure and to facilitate understanding of the present disclosure, but may not limit the scope of the present disclosure. Therefore, in addition to the embodiments of the present disclosure disclosed herein, the scope of the present disclosure should be construed to include all modifications or modified forms drawn based on the present disclosure, as defined by the appended claims and their equivalents.

What is claimed is:

1. An electronic device, comprising:
   a display;
   a housing including a front surface including the display, a rear surface facing a direction opposite to the front surface, and a side surface enclosing at least a part of a space defined between the front surface and the rear surface;
   a wireless communication module included in the housing;
   at least one antenna pattern electrically connected to the wireless communication module and configured to form an electromagnetic field or a magnetic field, wherein current is provided to the at least one antenna pattern upon receipt of a signal that is determined based on a polling period that corresponds to at least one predetermined condition of the electronic device;
   a detection circuit electrically connected to the at least one antenna pattern and configured to detect a current and/or a voltage associated with the at least one antenna pattern; and
   a processor electrically connected to the wireless communication module and the detection circuit,
   wherein the processor is configured to change at least a part of an operation of the electronic device, at least partly based on a change of the current and/or the voltage detected by the detection circuit.

2. The electronic device of claim 1, wherein the at least one antenna pattern comprises at least one of:
   a first antenna pattern extending along at least one side surface of the display to be adjacent to a part of the front surface, and disposed within the housing;
   a second antenna pattern disposed within the housing to be adjacent to a part of the rear surface; and
   a third antenna pattern forming at least a part of the side surface.

3. The electronic device of claim 1, wherein the at least one antenna pattern is a loop antenna pattern.

4. The electronic device of claim 1, wherein the at least one antenna pattern is a near field communication (NFC) antenna pattern.

5. The electronic device of claim 1, wherein, when the detected voltage corresponds to a voltage level of a gripped state, the processor is further configured to determine that the electronic device is in a gripped state, and when the detected voltage does not correspond to the voltage level of the gripped state, the processor is further configured to determine that the electronic device is in a non-gripped state.

6. The electronic device of claim 5, wherein, when the detected voltage returns to a default state from a state where the electronic device is gripped, the processor is further configured to determine that the gripped state of the electronic device is released.

7. The electronic device of claim 1, further comprising:
   a current providing module configured to supply a current to the at least one antenna pattern according to a predetermined period.

8. The electronic device of claim 7, wherein the predetermined period is changed to one of a first period and a second period depending on whether the display unit is turned on or turned off.

9. The electronic device of claim 7, wherein the predetermined period is changed to one of a first period and a second period depending on whether the electronic device moves.

10. The electronic device of claim 1, wherein the processor is further configured to determine which voltage level the detected voltage corresponds to among a plurality of predetermined voltage levels.

11. The electronic device of claim 10, wherein the plurality of predetermined voltage levels includes at least one of a voltage level in a state where no object is brought close to the electronic device; a voltage level corresponding to a state where the electronic device is gripped by a hand; a voltage level corresponding to a case where a metallic material is brought close to the electronic device; and a voltage level corresponding to a case where an object, having an influence on a magnetic field, other than a hand and a metallic material, is brought close to the electronic device.

12. The electronic device of claim 10, wherein the plurality of predetermined voltage levels includes at least one of a voltage level corresponding to a state where a part of a finger touches the electronic device; a voltage level corresponding to a state where the electronic device is gripped with a first intensity; and a voltage level corresponding to a state where the electronic device is gripped with a second intensity.

13. The electronic device of claim 1, wherein the voltage level corresponding to the gripped state is a voltage reduced from a voltage of a default state within a predetermined voltage level range.

14. A grip sensing method in an electronic device, the method comprising:
- supplying a current to at least one antenna pattern upon receipt of a signal that is determined based on a polling period that corresponds to at least one predetermined condition of the electronic device;
- detecting a current level and/or a voltage level by an electromagnetic field or a magnetic field formed by the at least one antenna pattern as the current is supplied; and
- determining whether the electronic device is gripped based on the detected current level and/or the detected voltage level.

15. The method of claim 14, wherein the at least one antenna pattern include a loop antenna pattern.

16. The method of claim 14, wherein the at least one antenna pattern include a near field communication (NFC) antenna pattern.

17. The method of claim 14, wherein determining whether the electronic device is gripped comprises:
- determining whether the electronic device is in a gripped state when the detected voltage corresponds to a voltage level of a gripped state; and
- determining whether the electronic device is in a non-gripped state when the detected voltage does not correspond to the voltage level of the gripped state.

18. The method of claim 17, further comprising:
- determining whether the gripped state of the electronic device is released when the detected voltage returns to a default state from a state where the electronic device is gripped.

19. The method of claim 14, wherein the current is supplied to the at least one antenna pattern according to a predetermined period.

20. The method of claim 19, wherein the predetermined period is changed to one of a first period and a second period depending on whether the display unit is turned on or turned off.

21. The method of claim 19, wherein the predetermined period is changed to one of a first period and a second period depending on whether the electronic device moves.

22. The method of claim 14, further comprising:
- determining which voltage level the detected voltage corresponds to among a plurality of predetermined voltage levels.

23. The method of claim 22, wherein the plurality of predetermined voltage levels includes at least one of a voltage level in a state where no object is brought close to the electronic device; a voltage level corresponding to a state where the electronic device is gripped by a hand; a voltage level corresponding to a case where a metallic material is brought close to the electronic device; and a voltage level corresponding to a case where an object, having an influence on a magnetic field, other than a hand and a metallic material, is brought close to the electronic device.

24. The method of claim 22, wherein the plurality of predetermined voltage levels includes at least one of a voltage level corresponding to a state where a part of a finger touches the electronic device; a voltage level corresponding to a state where the electronic device is gripped with a first intensity; and a voltage level corresponding to a state where the electronic device is gripped with a second intensity.

25. The method of claim 14, wherein a voltage level corresponding to a gripped state is a voltage reduced from a voltage of a default state within a predetermined voltage level range.

26. A non-transitory computer-readable storage medium that stores a grip sensing computer program therein, wherein, in an electronic device, the program executes a method comprising:
- supplying a current to at least one antenna pattern upon receipt of a signal that is determined based on a polling period that corresponds to at least one predetermined condition of the electronic device;
- detecting a current level and/or a voltage level by an electromagnetic field or a magnetic field formed by the at least one antenna pattern as the current is supplied; and
- determining whether the electronic device is gripped based on the detected current level and/or the detected voltage level.

* * * * *